(12) United States Patent
Fallahi et al.

(10) Patent No.: US 7,574,001 B2
(45) Date of Patent: *Aug. 11, 2009

(54) INTERNET PROTOCOL TELEPHONE SYSTEM

(75) Inventors: Siavash Fallahi, Newport Coast, CA (US); Kevin Brown, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 382 days.

This patent is subject to a terminal disclaimer.

(21) Appl. No.: 11/407,986

(22) Filed: Apr. 21, 2006

(65) Prior Publication Data

US 2006/0187606 A1 Aug. 24, 2006

Related U.S. Application Data

(63) Continuation-in-part of application No. 10/028,781, filed on Dec. 28, 2001.

(60) Provisional application No. 60/673,809, filed on Apr. 22, 2005, provisional application No. 60/258,777, filed on Dec. 28, 2000.

(51) Int. Cl.
*H04M 9/00* (2006.01)

(52) U.S. Cl. ............... 379/398; 379/399.01; 379/414

(58) Field of Classification Search ............ None
See application file for complete search history.

(56) References Cited

U.S. PATENT DOCUMENTS 4,796,295 A  1/1989 Gay et al.
5,828,244 A  10/1998 Palara et al.

(Continued)

FOREIGN PATENT DOCUMENTS

WO    WO 98/37665    8/1998
WO    WO 00/67452    11/2000

OTHER PUBLICATIONS

U.S. Appl. No. 10/028,781, Fallahi et al.*

(Continued)

*Primary Examiner*—Walter F Briney, III
(74) *Attorney, Agent, or Firm*—Sterne, Kessler, Goldstein & Fox P.L.L.C.

(57) ABSTRACT

An internet protocol telephone includes a substrate having an input and an output that are capable of being connected to the internet protocol (IP) network. A relay is disposed on the substrate and is connected between the input and the output of the substrate. The relay includes first and second native FETs that have a threshold voltage of approximately zero volts. Therefore, the relay is nominally turned-on, even when little or no voltage (or power) is applied to the IP telephone substrate, as during the discovery mode of IP telephone operation. During discovery mode, The IP phone is configured to be responsive to extended link pulses and block data packets that are associated with legacy devices. Data packets have a higher signal duration and are more continuous than extended link pulses. The IP phone includes a switchable ground that is connected to the gates of the native devices, and is controlled by a rectifier and filter circuit that are connected to the substrate input. If the IP phone receives legacy data packets during discovery mode, then the high signal duration and continuous nature of the data packets are sufficient to cause the rectifier to generate a rectified signal having sufficient amplitude to activate the switchable ground, so as to ground the gates of the native devices and therefore turn-off the native devices. Therefore, the data packets are rejected and are not passed back to the switch. Extended link pulses have a frequency that is too low to generate a rectified signal that is sufficient to activate the switchable ground, and therefore the native devices remain turned-on. Accordingly, the extended link pulses are passed back to the switch.

22 Claims, 24 Drawing Sheets

U.S. PATENT DOCUMENTS 5,881,148 A      3/1999   Koenig et al.
5,886,925 A * 3/1999   Campardo et al. ..... 365/185.21
6,018,263 A * 1/2000   Tihanyi ...................... 327/374
6,535,983 B1 * 3/2003   McCormack et al. ....... 713/310

OTHER PUBLICATIONS

International Search Report, dated Jul. 10, 2002, for PCT/US01/50437, prepared by European Patent Office.

The Written Opinion for International Appln. No. PCT/US01/50437, issued May 20, 2003, 5 pages.

Foo, S., et al., "A Telephone Adapter For Internet Telephone Systems," *Microprocessors and Microsystems*, 21:213-221, IPC Business Press Ltd, (Dec. 1997).

Hafer, R., "Designing Telephone-Interface Circuitry With Solid-State Relays," *Electronic Design*, Penton Publishing, 38:91-93 and 95-96, (Dec. 1990).

* cited by examiner

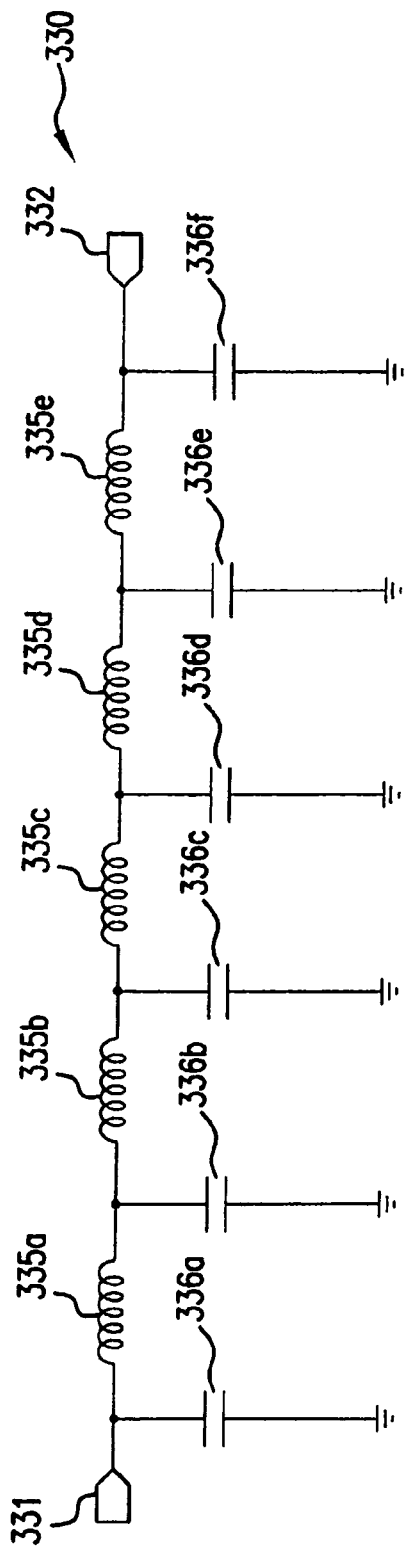
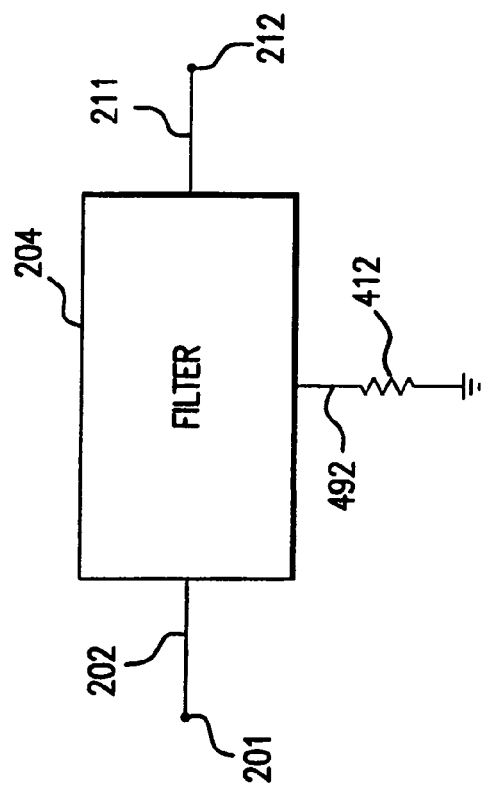
FIG.3d
FIG.4a

INTERNET PROTOCOL TELEPHONE SYSTEM

CROSS-REFERENCE TO RELATED APPLICATIONS

This application claims the benefit of U.S. Provisional Application No. 60/673,809, filed on Apr. 22, 2005, which is incorporated herein by reference in its entirety; and This application is also a continuation-in-part of application Ser. No. 10/028,781, filed on Dec. 28, 2001, which claims the benefit of U.S. Provisional Application No. 60/258,777, filed on Dec. 28, 2000, both of which are incorporated by reference herein in their entirety.

BACKGROUND OF THE INVENTION

1. Field of the Invention

The present invention is related to a communications device. More specifically, the present invention is related to an Internet Protocol (IP) telephone having an on-chip native device relay, and an on-chip rectifier and filter for controlling the native device relay during discovery and normal operation modes.

2. Background Art

In addition to data communications, the Internet can also be used to carry voice telephony. One conventional system that carries voice communications over the Internet utilizes an Internet Protocol (IP), and such telephones are referred to as IP telephones.

The data terminal equipment (DTE) of an IP telephone includes a telephone line that is connected to a computer device through a series-connected relay (i.e. switch). The relay switches an incoming telephone signal to either the computer or to a filter that is connected in parallel with the computer. The filter is connected/disconnected across the computer depending on the state of the IP phone system by closing/opening the associated relay. In a no power or "discovery" mode, the relay is switched so the filter is connected across a physical layer input of the computer. Therefore, the filter receives an incoming signal on the telephone line (or cable, e.g. CAT-5) and returns low frequency signals back down the telephone line, without the incoming signal reaching the physical layer of the computer. The reflected low frequency signals indicate that a compatible IP phone is available for use. Specifically, during this auto-negotiation, the low frequency signal that is sent to identify IP phones (and other compatible devices) is referred to as an "extended link pulse". In contrast, legacy switches send normal link pulses to identify legacy devices prior to data packet transmission.

When power is applied to the relay in a "normal operation" mode, the relay is switched so the filter is disconnected from the input of the physical layer of the computer. Therefore, the filter does not effect the incoming signal, and the incoming signal is applied to the physical layer of the computer for further processing.

The continual opening and closing of the relay creates wear and tear of the relay components as the conventional IP phone switches between the discovery and normal modes, eventually causing component failure. It would be more cost-effective to keep the filter connected at all times, thereby eliminating relay replacement. Additionally, the conventional relay is not integrated with the computer or the filter, which increases the manufacturing part count and ultimately the manufacturing cost of an IP Phone.

The conventional IP telephone also includes a signal termination circuit that provides a good input impedance for the incoming signal when the filter is not connected across the computer. Proper signal termination is necessary to provide a good signal match, which aids in proper signal reception during the normal operation mode. The termination circuit is a separate off-chip device, which increases the manufacturing part count and ultimately the manufacturing cost of an IP Phone. It is desirable to integrate the termination circuit in order to reduce the part count during the manufacturing process.

The filter in the conventional IP telephone is a conventional lowpass filter. The conventional lowpass filter has an input impedance that is highly dependent on the frequency of the input signal that is delivered to the filter. Input frequencies that are outside of the filter passband are substantially reflected, which can produce an undesired high return loss. Also, conventional filters are highly sensitive to variations in the filter components and in the variation of components that are connected to the filter.

An additional problem can occur when an IP phone is connected to a switch via relatively short cable. Specifically, if a legacy switch sends normal link pulses over the LAN to an IP telephone, the normal link pulses can pass through the filter without sufficient attenuation during discovery mode, thereby causing the legacy switch to think the IP phone is a legacy device. In other words, the devices will link up. If the legacy switch then transmits data packets over the LAN, then these data packets can also pass through the filter, creating an unintended signal loop that violates IEEE standards.

What is needed is a filter that has a constant impedance for all frequencies, even frequencies that are outside the passband of the filter. Furthermore, the filter should be relatively insensitive to component variation.

Further, it would also be desirable to an IP phone that can distinguish between data packets and extended link pulses for short cable length applications, and prevent the re-transmission of data packets during discovery mode to as to prevent unauthorized signal loop transmissions.

BRIEF SUMMARY OF THE INVENTION

The present invention relates to a communication device that is capable of being connected to a communications network. The communications device can be, for example, an internet protocol (IP) telephone that is connected to an IP telephone network. Alternatively, the communications device can a wireless access point, a laptop computer, or a local switch.

The communications device includes a physical layer having a substrate with an input and an output that are capable of being connected to the internet protocol (IP) network. A relay is disposed on the substrate and is connected between the input and the output of the substrate. The relay includes first and second native FETs that have a threshold voltage of approximately zero volts. Therefore, the relay is nominally turned-on, even when little or no voltage (or power) is applied to the physical layer substrate, as during the discovery mode of IP telephone operation.

During discovery mode, the communications device is configured to be responsive to extended link pulses and block data packets that are associated with legacy devices. Data packets have a higher signal duration than extended link pulses. In other words, data packets are more continuous than extended link pulses so as to have more energy on the cable for a much longer period of time than extended link pulses. For example, data packets can be signal bursts that last as long as 1-3 microseconds. The communications device recognizes the difference in signal duration between the data packets and the extended link pulses, and opens the relay for data packets.

The communications device (e.g. IP phone) includes a switchable ground that is connected to the gates of the native devices. The switchable ground is controlled by a rectifier and filter circuit that are connected to the substrate input. If the communications device receives data packets during discovery mode, then the continuous nature of the data packets will cause the rectifier to generate a rectified signal with sufficient amplitude to activate the switchable ground. The output of the rectifier is low pass filtered. As a result, the rectifier output grounds the gates of the native devices and therefore turns-off the native devices after some delay of receiving the data packets. Therefore, the data packets are rejected and are not passed back to the IP switch. Extended link pulses have a signal duration that is too low to generate a rectified signal that is sufficient to activate the switchable ground. Therefore, the native devices remain turned-on. Accordingly, the extended link pulses are passed back to the IP switch.

During normal operation, additional rectifier circuits rectify an input signal received at an input of the filter, to produce a rectified signal that is applied to the gates of the first and second native FETs, so as to further improve the conductivity of the relay.

Further features and advantages of the invention, as well as structure and operation of various embodiments of the invention, are disclosed in detail below will reference to the accompanying drawings.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 3d illustrates a conventional Butterworth filter.

FIG. 4a illustrates a block diagram of the filter functions in the present invention.

DETAILED DESCRIPTION OF THE INVENTION

Conventional Internet Protocol Telephone

Figure 1A:
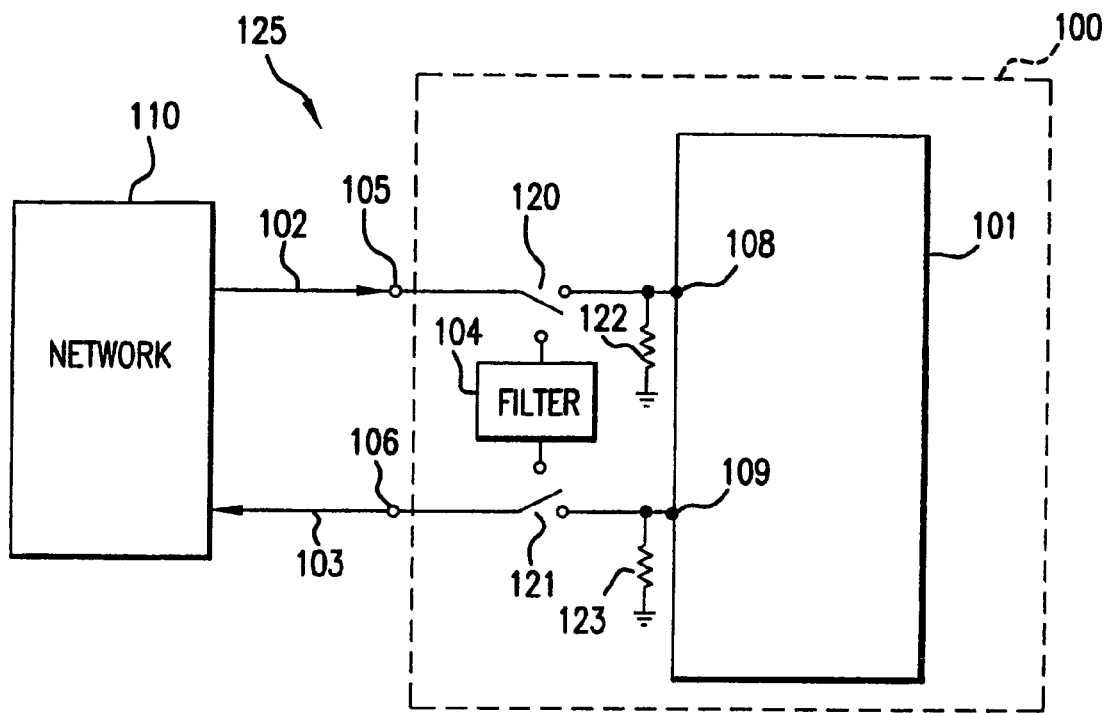
FIG. 1a illustrates a conventional IP telephone, wherein a filter is placed between two relays, and termination resistors are placed outside a computer chip.

FIG. 1a illustrates a conventional IP telephone system 125 having a data network 110 and a conventional IP telephone 100. The data network 110 can be the publically available Internet, or another type of public or private network. The IP telephone 100 receives signals 102 from the network 110 at an input terminal 105, and transmits signals 103 to the data network 110 at the output terminal 106. In embodiments, the signals 102 and 103 carry voice communications using Internet Protocol.

The IP telephone 100 includes a filter 104, relays 120 and 121, and a physical layer 101 that is part of a computer chip (not shown) or other type of integrated circuit. The computer chip processes voice and data signals that are sent to and received from the data network 110. The relay 120 connects the input terminal 105 to either the filter 104 or an input terminal 108 of the physical layer 101. Likewise, the relay 121 connects the output terminal 106 to either the filter 104 or an output 109 of the physical layer 101. The relays 120 and 121 are nominally connected to the filter 104 when no power is applied to the relays. (i.e., discovery mode) When power is applied, the relays 120 and 121 switch and connect the terminals 105 and 106 to the respective terminals 108 and 109 of the physical layer 101 (i.e., normal operation mode). Grounded termination resistors 122 and 123 are inserted between the filter 104 and physical layer 101 to provide a good match and prevent unwanted signal reflections from affecting the input and output signals 102 and 103.

Figure 1B:
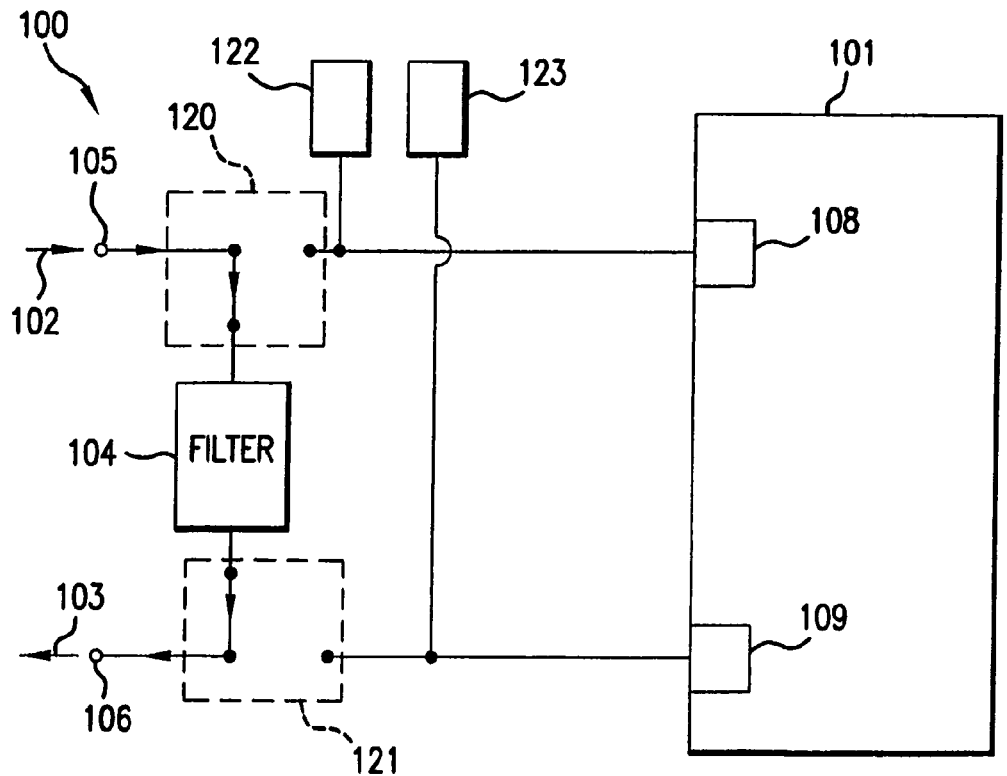
FIG. 1b illustrates a block diagram of a conventional IP telephone in discovery mode.

FIG. 1b further describes the operation of the IP phone in discovery mode, where no power is applied to either the relays 120, 121, or the physical layer 101. During discovery mode (FIG. 1b), the relay 120 connects the input terminal 105 to the input of the filter 104, and the relay 121 connects the output of the filter 104 to the output terminal 106. Therefore, the input signal 102 is filtered by the filter 104 and the filtered output is re-transmitted to data network 110 as the transmit signal 103. The filter 104 is configured as a lowpass filter with a pre-determined cutoff frequency that is compatible with the data network 110. In discovery mode, the data network 110 analyzes the transmit signal 103 for the correct low frequency components to determine that the IP phone 100 is compatible for future communication.

Figure 1C:
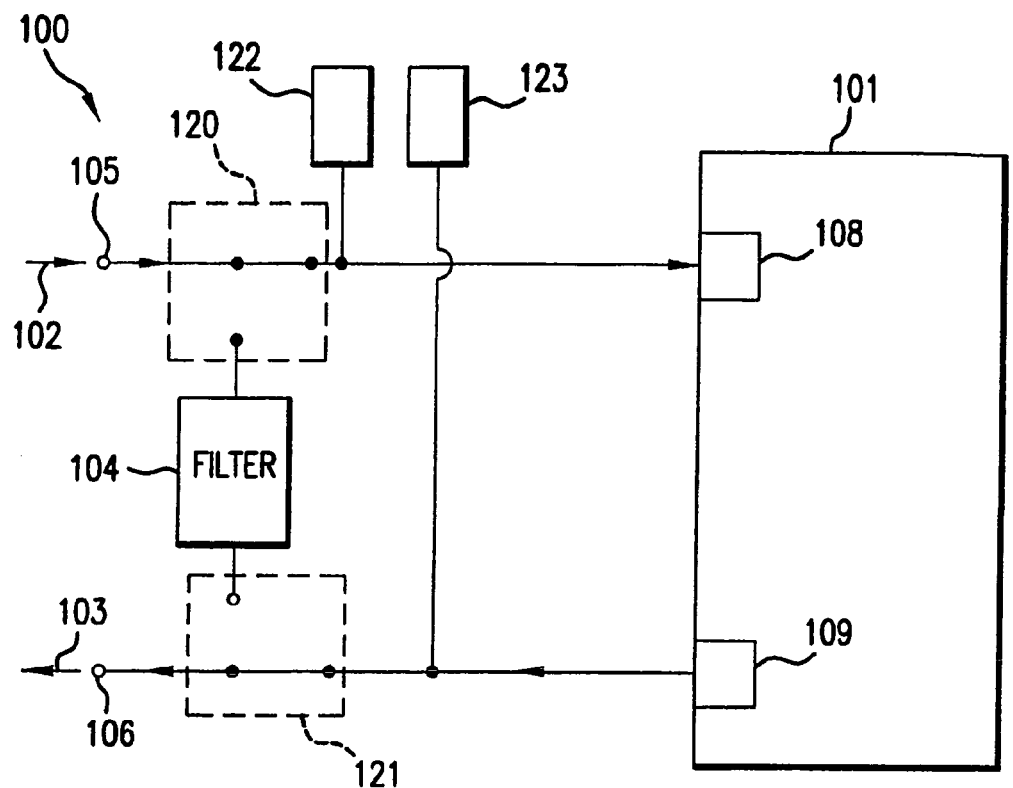
FIG. 1c illustrates a conventional IP telephone in normal operation mode.

FIG. 1c further describes the operation of the IP phone 100 in normal operation mode, where power is applied to the relays 120, 121, and the physical layer 101. During normal operation (FIG. 1c), the relay 120 switches the input terminal 105 from the filter 104 to the physical layer input 108. Likewise, the relay 121 switches the output terminal 106 from the filter 104 to the output 109 of the physical layer 101. Therefore the physical layer input 108 is connected to the receive terminal 105, and the physical layer output 109 is connected to the output terminal 106 so that communication with the network 110 can commence. The resistor 122 should be highly accurate as the impedance of this resistor circuit must be matched with the impedance of the physical layer to prevent signal mismatch.

The IP phone 100 is relatively expensive to implement because the relay mechanisms 120 and 121, and the termination resistors 122 and 123 are located outside the physical layer 101, resulting in increased assembly cost.

IP Phone System with On-Chip Relay and Constant Impedance Filter

Figure 2A:
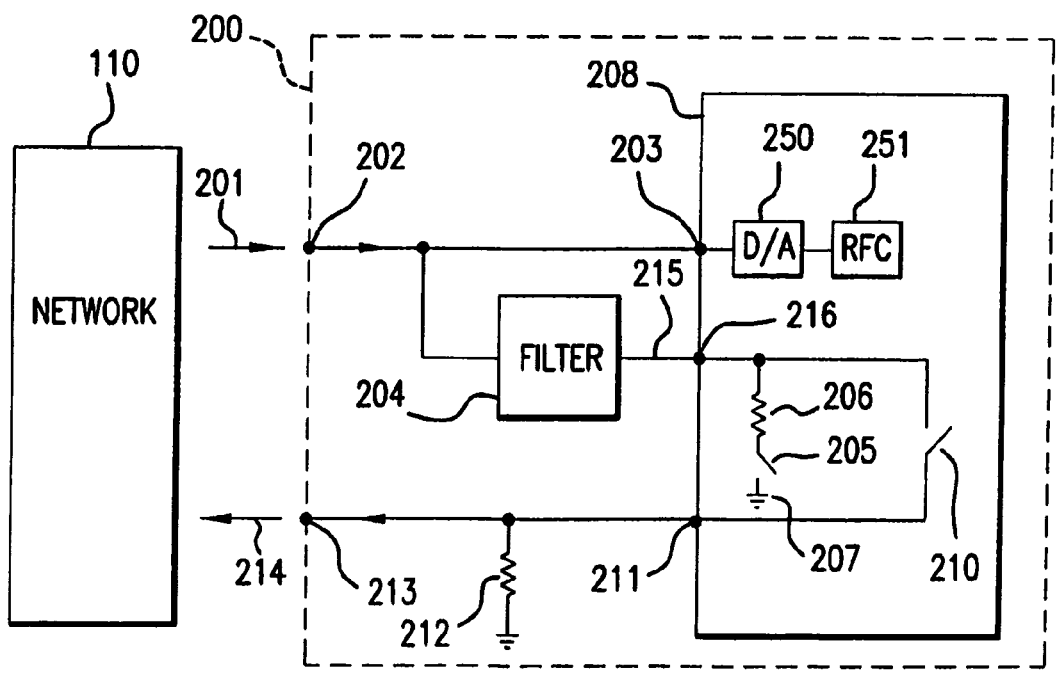
FIG. 2a illustrates an IP telephone having a filter continually connected to the computer at all times, according to embodiments of the present invention.

FIG. 2a illustrates IP telephone 200 according to embodiments of the present invention. IP telephone 200 has on-chip relays and a constant impedance filter according to embodiments of the present invention. The IP telephone 200 receives signals 201 from the network 110 at an input terminal 202, and transmits signals 214 to the network 110 at an output terminal 213.

IP telephone 200 includes a first termination resistor 212, a filter 204, and a physical layer 208 that is part of a computer chip (not shown), or other IC. The physical layer 208 can be implemented on a semiconductor substrate, for example and CMOS substrate. The physical layer 208 includes a second termination resistor 206, a switch 205, and a relay 210 that are all located on the physical layer 208, which is distinct from the conventional IP phone 100 that has the relays and both termination resistors located off-chip. Furthermore, the filter 204 is permanently connected to an input terminal 202 of the IP phone 200. Therefore, the filter 204 is not switched in and out of the receive path, as in the conventional IP phone 100.

The relay 210 includes a native MOSFET device, which has a threshold voltage that is equal to substantially zero volts. Therefore, the relay 210 conducts even when no voltage is applied to the gate of relay 210. Whereas, the switch 205 is conventional MOSFET device that requires a non-zero voltage source to close the switch 205. The properties of the relay 210 and native devices are further described herein.

Figure 2B:
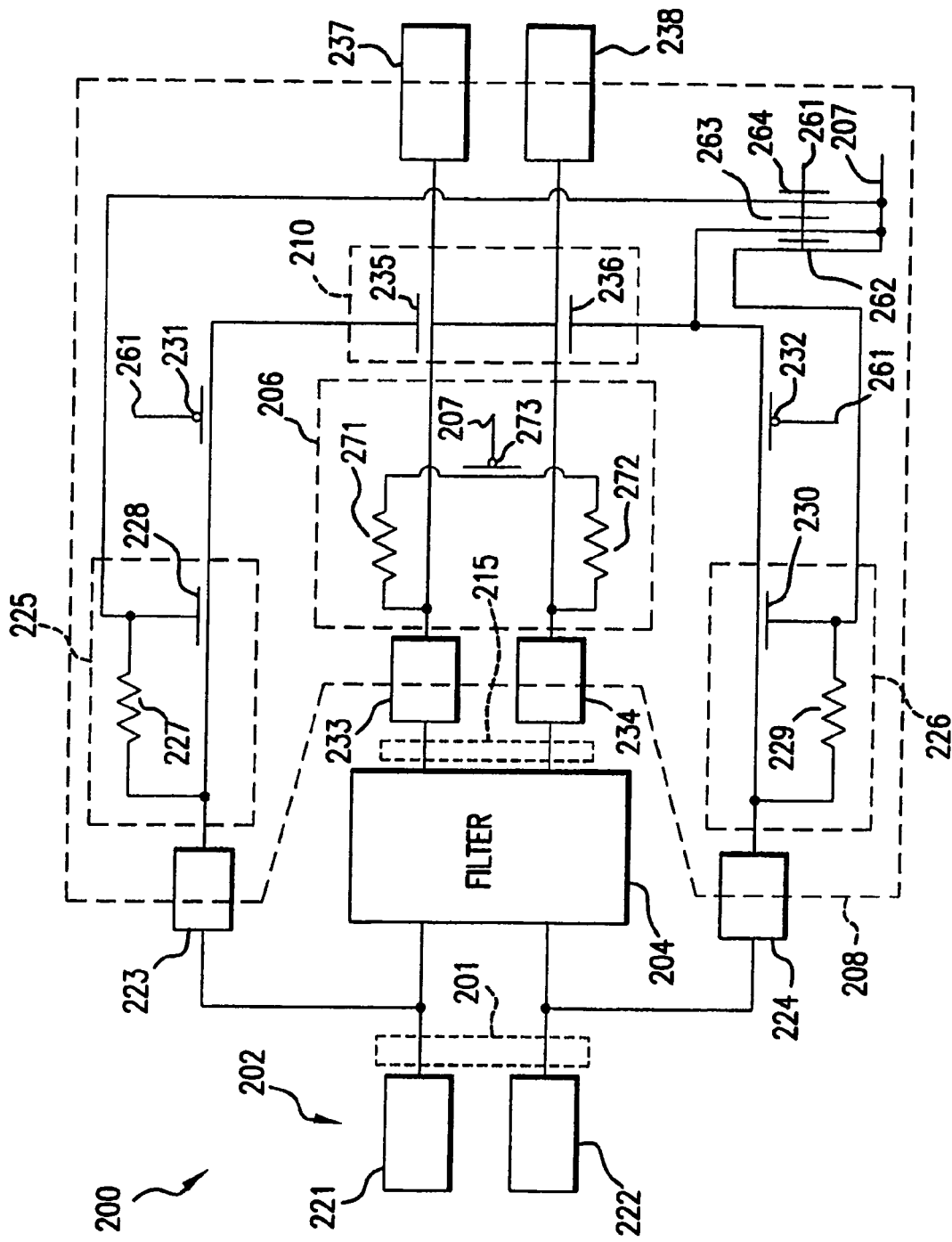
FIG. 2b illustrates a block diagram of an IP telephone according to the present invention.
Figure 2C:
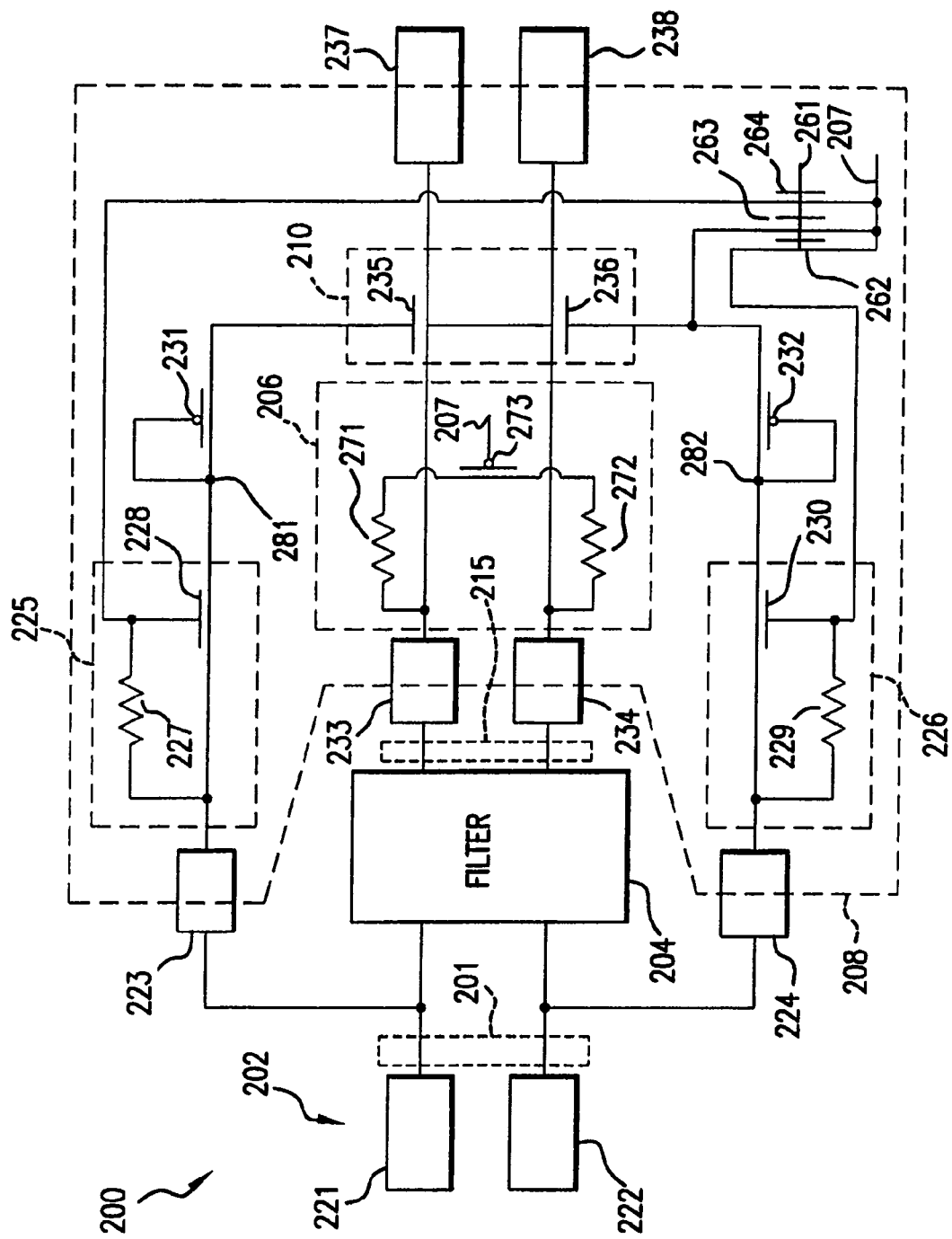
FIG. 2c is another embodiment of a present invention IP telephone system.
Figure 2D:
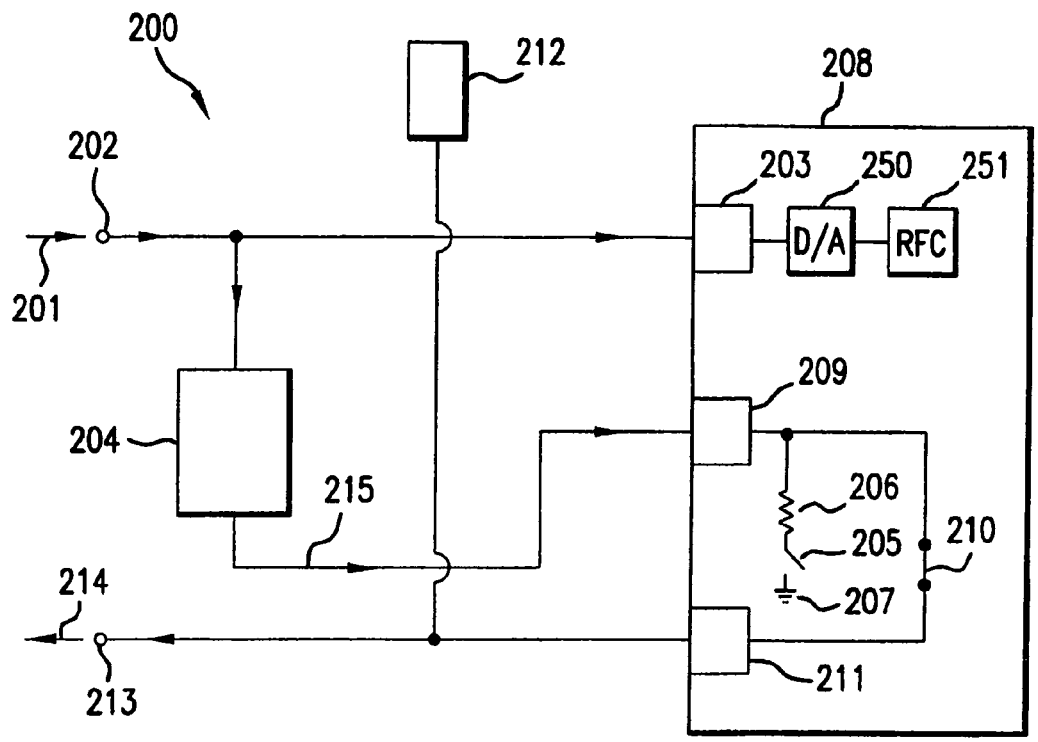
FIG. 2d illustrates a block diagram of an IP telephone in discovery mode, according to embodiments of the present invention.

FIG. 2d further describes the operation of the IP phone 200 in discovery mode, where no power is applied to the physical layer 208.

During discovery mode, the filter 204 receives the input signal 201 and generates a filtered output signal 215 that is applied to the physical layer 208 at terminal 209. The relay 210 is closed during discovery mode so that the filtered output signal 215 is transmitted to the data network 110 as the output signal 214. The filter 204 is configured as a lowpass filter with a pre-determined cutoff frequency that is compatible with the data network 110. In discovery mode, the data network 110 analyzes the transmit signal 214 for the correct low frequency components to determine that the IP phone 200 is compatible for future communication. The input signal 201 is also received at the physical layer input terminal 203. However, no power is applied to the physical layer 208 during discovery mode, so the A/D 250 and receiver 251 are not powered up. Therefore, the input signal 201 is not further processed by the physical layer 208 during discovery mode.

Figure 2E:
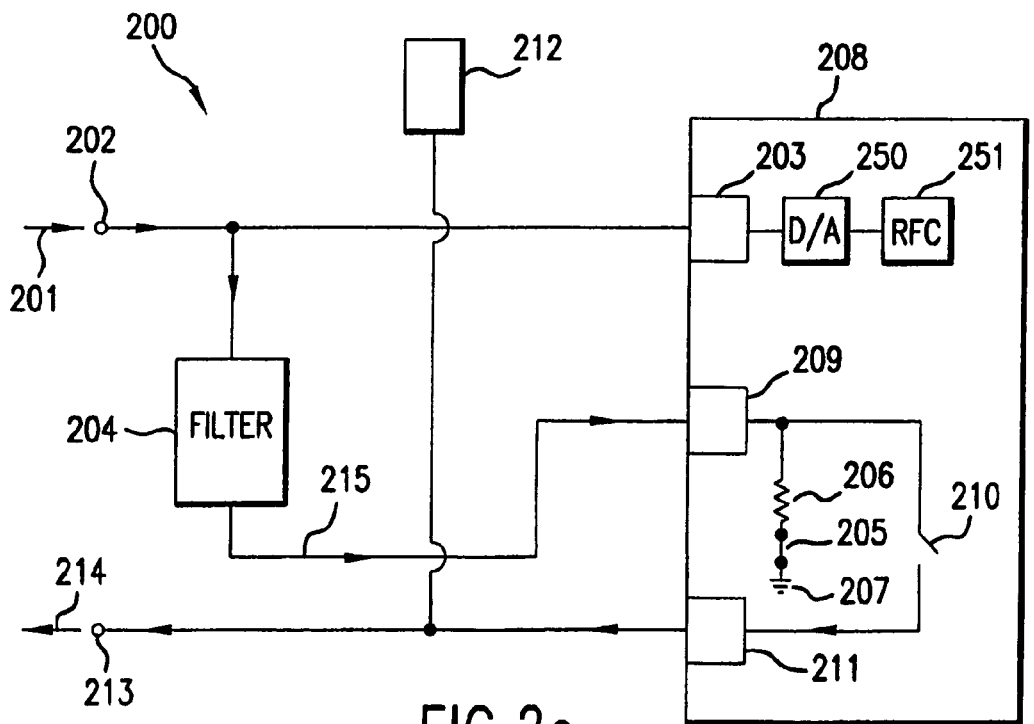
FIG. 2e illustrates a block diagram of an IP telephone in normal operation mode, according to embodiments of the present invention.

FIG. 2e further describes the operation of the IP phone 200 in normal operation mode, where power is applied to the physical layer 208. During normal operation, power is applied to the physical layer 208, which opens the relay 210 and closes the switch 205. By opening the relay 210, the filter output 215 is not re-transmitted to the data network 110. However, the physical layer 208 is powered-up so that the input signal 201 is received at the physical layer 208. There is no need for an extra termination resistor located off-chip, such as termination resistor 122 of FIG. 1c, because the impedance of the filter 204 and the termination resistor 206 matches the input impedance. As will be described later with respect to the filter 204, the filter 204 is insensitive to component variation. Therefore, the termination resistor 206 can be placed on-chip and does not affect filter 204 frequency response or impedance of the filter 204. The filter 204 and the termination resistor 206 serve to properly terminate the signal on-chip. Furthermore, the analog-to-digital converter 250 and the receiver 251 further process the signal 201. More specifically, the analog to digital converter 250 samples and encodes the analog signal to create a digital signal. The process may be accomplished by a digital signal processor (DSP). The receiver 251 is a device that receives a transmission signal. The receiver 251 may also be described as a portion of a telecommunications devices that decodes an encoded signal into a desired for. For example, the receiver 251 process the digital signal from the analog to digital converter 250 to extract useful information from the data network 110. Furthermore, the physical layer output terminal 211 is still directly connected to the output terminal 213. Therefore, normal communications are carried-on with the network 110 through the input terminal 202 and output terminal 213.

A high-level diagram of the constant impedance filter 204 is shown in FIG. 4a. The filter 204 accepts the input signal 201 and selects a band of frequencies in the filter output 215 that are passed to the input 209 of the physical layer 208. Furthermore, the filter 204 terminates any undesired frequencies 492 that are not passed to the output 212. The filter 204 is described further in following sections.

Other embodiments of the Internet Protocol system are possible, however, the above is a description of one embodiment and not to be construed as limiting the scope of the present invention, except as designated by the claims that follow.

Relay

FIG. 2b further illustrates the physical layer 208 that has the relay 210 and the termination resistor 206. The physical layer 208 is illustrated in a differential implementation, as compared to a single-ended implementation. The termination resistor 206 is connected to the output of the filter 204 via input terminals 233, 234, where terminals 233, 234 represent a differential input for input 216. The termination resistor 206 is implemented with resistors 271, 272, and PMOSFET 273.

The relay 210 is connected to the output of the termination resistor 206, and is implemented with output native devices 235 and 236. The output native devices 235 and 236 are connected to respective output terminals 237 and 238, where terminals 237 and 238 represent a differential output for output 211 in FIG. 2b.

Furthermore, the physical layer 208 also includes rectifier circuits 225 and 226, and PMOSFETs 231 and 232. The rectifier circuit 225 includes a resistor 227 and a native device 228. The input of the rectifier circuit 225 is connected to the input terminal 221 via filter pin 223, and output is connected to the gate of the output native device 235 through PMOSFET 231. Likewise, the input of the rectifier circuit 226 is connected to the input terminal 222 via filter pin 224, and the output is connected to the gate of the output native device 236 through PFET 232. As will be discussed further herein, the rectifier circuits 225 and 226 rectify the input 201 and apply the rectified signal to the gate terminals of the native devices 235, and 236, so as to further turn-on the relay 210 during the discovery mode. PFETs 231 and 232 are biased to conduct during the discovery mode, so as to apply the rectified outputs from the rectifiers 225 and 226 to the gates of the respective output native devices 235 and 236. However, the PFETs 231 and 232 are biased to be cutoff during normal operation mode, so as to prevent the rectified outputs from the rectifiers 225 and 226 from reaching the gates of the respective output native devices 235 and 236. Additionally, the output native devices 235 and 236 are biased such that in normal operation mode, the gate-to-source voltage, Vgs, is a negative voltage. This ensures that the native devices are turned off. This is done by grounding the gate of the native devices and holding drain and source at the supply voltage.

In the discovery mode, when no power is applied to the physical layer 208, the relay 210 passes through signals 201 to allow for signal detection by the network 110. However, in the normal operation mode, when the physical layer 208 is powered up, the relay 210 does not allow passage of signals through to the network 110. Furthermore, the relay 210 serves to prevent any possible "leakage" of signals through the relay and minimize the return loss during the normal operation mode. The relay 210 is constructed using native devices, which are capable of operating without any power applied to them. This allows for better conductivity of the relay and faster detection of the signal by the network 110 during the discovery mode. In the normal operation mode, the native devices are grounded using additional semiconductor devices. These additional devices operate with application of voltage to them, while the sources and drains of the native devices are held at the supply voltage. The details of the relay schematic and its implementation in the discovery and the normal operation modes are discussed below.

Discovery Mode

In the discovery mode, (as described by FIG. 2d), the physical layer 208 functions without any power applied to it. The relay 210 is closed in order to facilitate detection of a filtered signal 215 by the network 110. More specifically, the output native device 235 and 236 are closed. The differential signal received at the input terminals 221 and 222 (similar to receive input 202 of FIG. 2a) is filtered through the constant impedance filter 204 and passed through the relay 210. The output of the relay 210 is transmitted out through transmit output terminals 237 and 238 (similar to the output terminal 213 of FIG. 2a) and is detected by the network 110. In the discovery mode, the relay 210 is capable of rectifying the filtered signal 215 thereby increasing a voltage on the native devices, which it employs, and increasing general conductivity of the relay 210.

As previously mentioned, the relay 210 uses native devices. The native device, NMOSFET or NMOS (n-channel metal oxide semiconductor field effect transistor), is a device that has a quality of being conductive when no bias voltage is applied. In other words, the threshold voltage, Vthresh, is equal to zero. In one embodiment, the threshold voltage of the native device is approximately from <100 mV to +100 mV. Whereas, conventional relays employ regular MOSFET devices. Conventional MOSFET devices require a bias voltage to put them in the conductive state, i.e., a standard depletion voltage of about 400 mV is needed. The use of native devices creates a better relay that is capable of being closed during the discovery mode. In other words, no voltage is required to close the relay, and the relay is open during the normal operation mode by application of a voltage to the physical layer.

The physical layer 208 includes rectifier circuits that rectify the input signal 207, and apply the rectified voltage to the gate of the output native devices 235 and 236. Referring to FIG. 2b, two rectifier circuits 225 and 226 are shown connected to the filter pins 223 and 224, respectively. The filtered signal 215 is passed through the rectifier circuits 225 and 226, where it is rectified. The rectifier circuit 225 consists of a native device 228 and a resistor 227. The rectifier circuit 226 consists of a native device 230 and a resistor 229. The rectifier circuits 225 and 226 are connected to a pair of output native devices 235 and 236, respectively, as shown in FIG. 2b.

PFET 231, connected between the rectifier circuit 225 and the output native device 235 is not engaged in the discovery mode, thereby allowing direct connection between the rectifier circuit 225 and the output native device 235. PFET 232, connected between the rectifier circuit 226 and the output native device 236 is not engaged in the discovery mode, thereby allowing direct connection between the rectifier circuit 226 and the output native device 236. Since, the rectifier circuits 225 and 226 are using native devices to rectify the filtered signal 215, such rectification increases amplitude of the signal 201, which increases the voltage on the gates of the output native devices 235 and 236. This increases the general conductivity of the relay and faster detection of signal by the output terminals 237 and 238. This provides for faster detection of the signal at the output terminals 237 and 238 and, hence, the network 110. Such detection of the signal by the network 110 alerts the network of the presence of the compatible IP telephone system 200, placing the entire system into the normal operation mode.

Figure 5A:
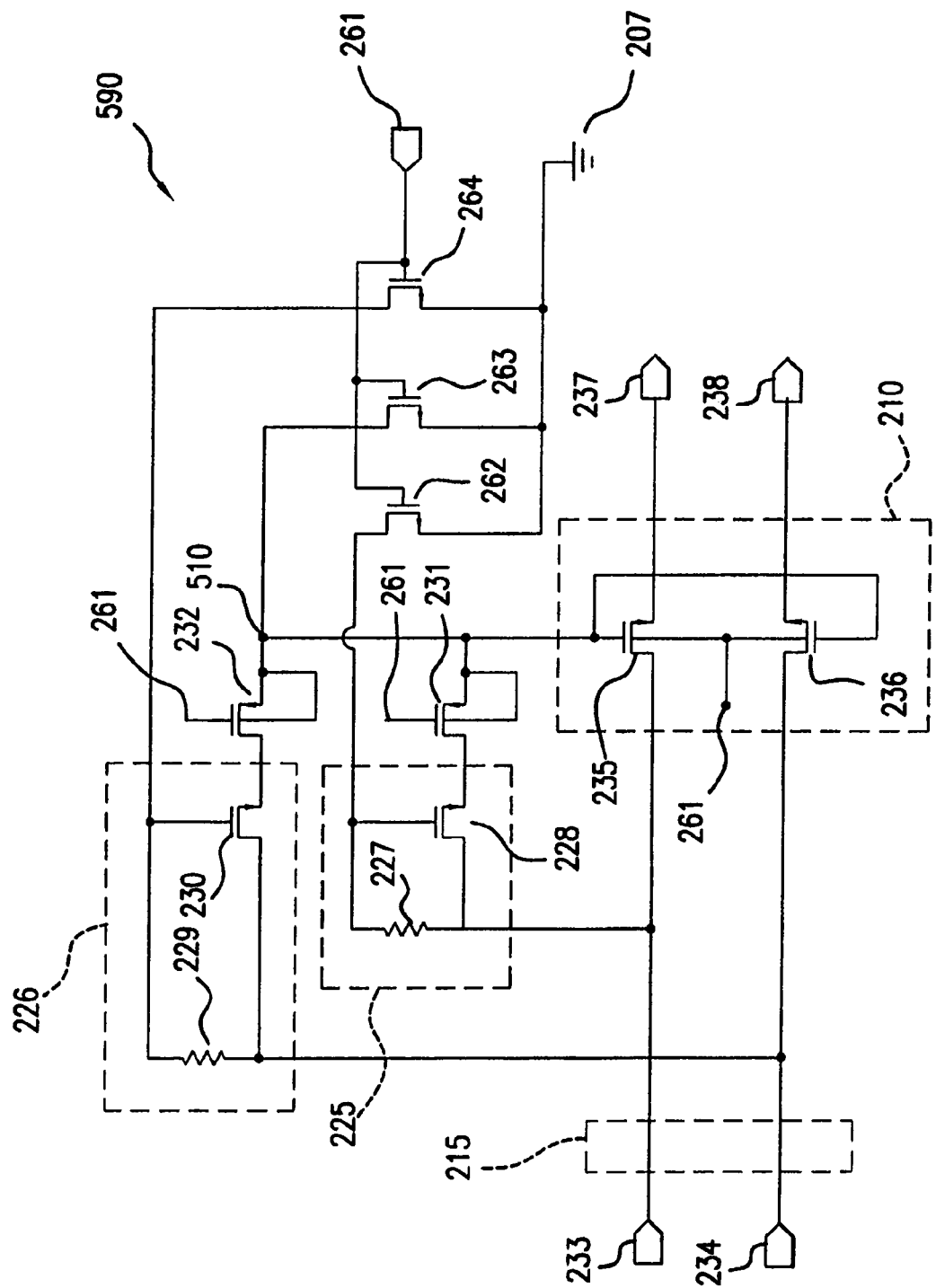
FIG. 5a further illustrates a present invention relay.

The relay 210 is shown in more detail in FIG. 5a. The embodiment shown in FIG. 5a is one of the four embodiments that the relay 210 may take (others are shown in FIGS. 5b-5e and will be described later). FIG. 5a, as well as FIGS. 5b-5e, show a portion 590 of the physical layer 208. In this embodiment, the relay 210 has positive and negative input terminals 233 and 234 as well as positive and negative output terminals 237 and 238, respectively (as also shown in FIG. 2b). The positive terminal 233 is connected to the rectifier circuit 225 and the negative terminal 234 is connected to the rectifier circuit 226. Each of the rectifier circuits are described above in reference to FIG. 2b. The rectifier circuits 225 and 226 are connected to the output native devices 235 and 236 having a common gate connection 510. As stated above, the PMOS devices 231 and 232, which are active in the normal operation mode, are not engaged in the discovery mode. These devices 231 and 232 serve to ground the gates of native devices 230 and 228 during the normal operation mode. Furthermore, another series of gate grounding devices 262, 263 and 264 are added. These devices are conventionally known NMOS devices and are also employed during the normal operation mode. These devices serve to ground the common gate connection 510.

Referring to FIG. 5a, the filtered signal 215 is received at the input terminals 233 and 234. The rectifier circuits 225 and 226 rectify the signal 215 and increase its amplitude. The PFETs 231 and 232 are biased closed during discovery mode. Therefore, the output of 226 and 227 are applied to 510, which increases the voltage at the common gate connection 510. This, in turn, increases gate voltage on the output native devices 235 and 236 making these native devices more conductive, which increases conductivity of the entire relay 210.

Figure 5B:
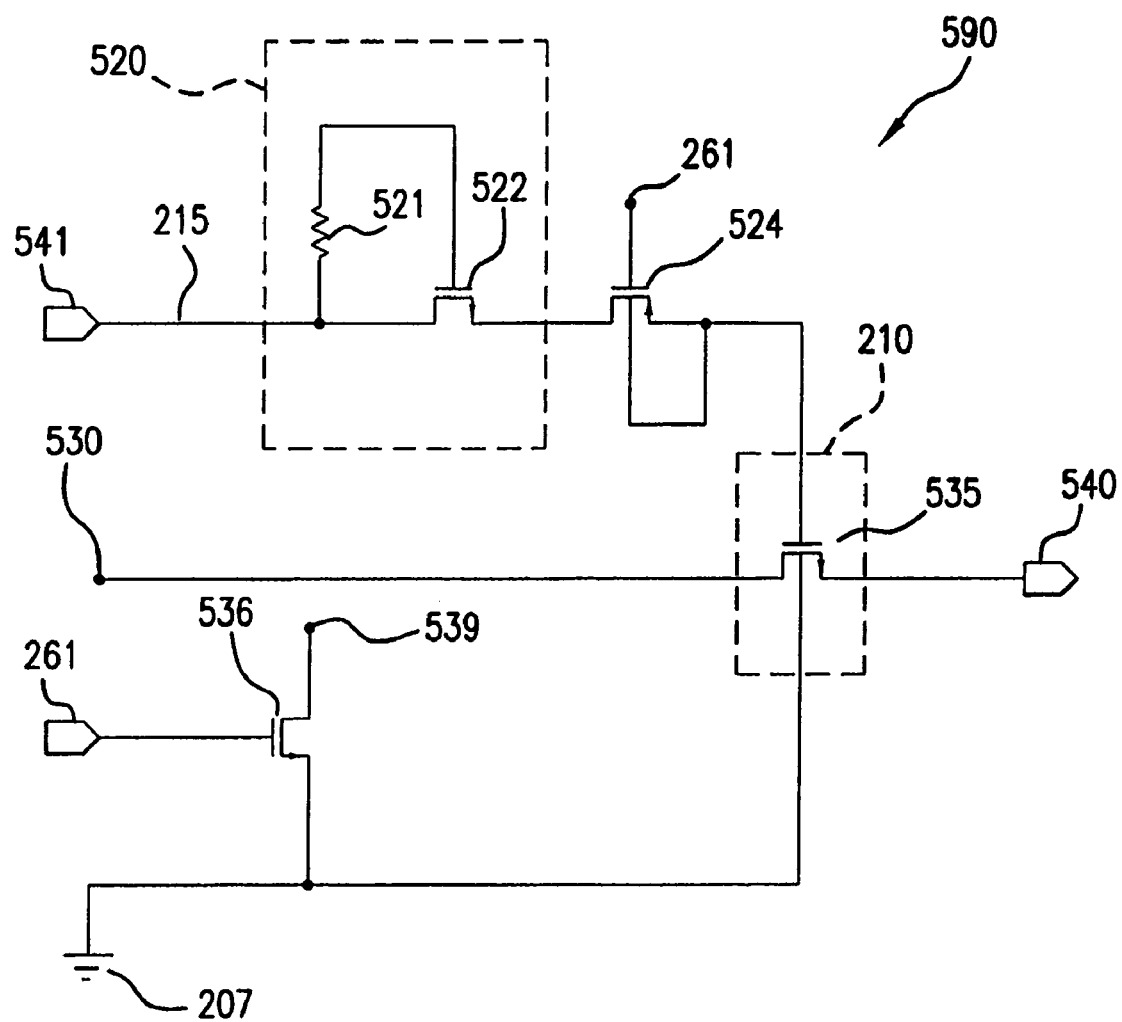
FIG. 5b illustrates another embodiment of the relay in the present invention.

The embodiment depicted in FIG. 5a does not account for a possible delay in transmission of a signal from the filter during the discovery mode. Referring to FIG. 5b, another embodiment of the relay is shown. This embodiment of the relay 210 accounts for a possible delay of signal transmission within the filter. Here, the relay 210 is shown to have input terminals 530 directly connected to output native devices 535 (similar to output native devices 235 and 236 of FIG. 2b) and output terminal pads 540. The relay 210 rectifier circuits 520 (similar to rectifier circuits 225 and 226 in FIG. 2b) are directly attached to the filter pins 541, which in turn are connected to the constant impedance filter 204 (not shown). Each rectifier circuit 520 comprises a resistor 521 and a native device 522, as shown in FIG. 5b. The rectifier circuits 520 are further connected to PMOS devices 524, which serve to ground the gates of native devices 522 during the normal operation mode (similar to devices 231 and 232 in FIG. 2b). These devices (as well as gate grounding devices 536 with respect to the gates of the native devices 535) do not ground the gates of native devices 522 during the discovery mode, since no power is applied to turn the devices 524 on. The devices 524 and 536 and their functions will be described later in connection to the normal operation mode.

With respect to FIG. 5b, an incoming signal would come directly to the rectifier device 522 and PMOS device 524, bypassing the filter off-chip. This reduces or eliminates any signal delay caused by the rectifiers. By the time the signal passes through the filter 204 and comes through the input 530 and reaches the output native devices 535, the rectifier 522 and PMOS device 524 have already conditioned the signal and have turned on the native devices 535 by applying the rectified signal at the gate of the native device 535. Subsequently, the voltage on the gates of the native devices 535 is increased, making these devices more conductive, thus, increasing conductivity of the entire relay 210.

Figure 5C:
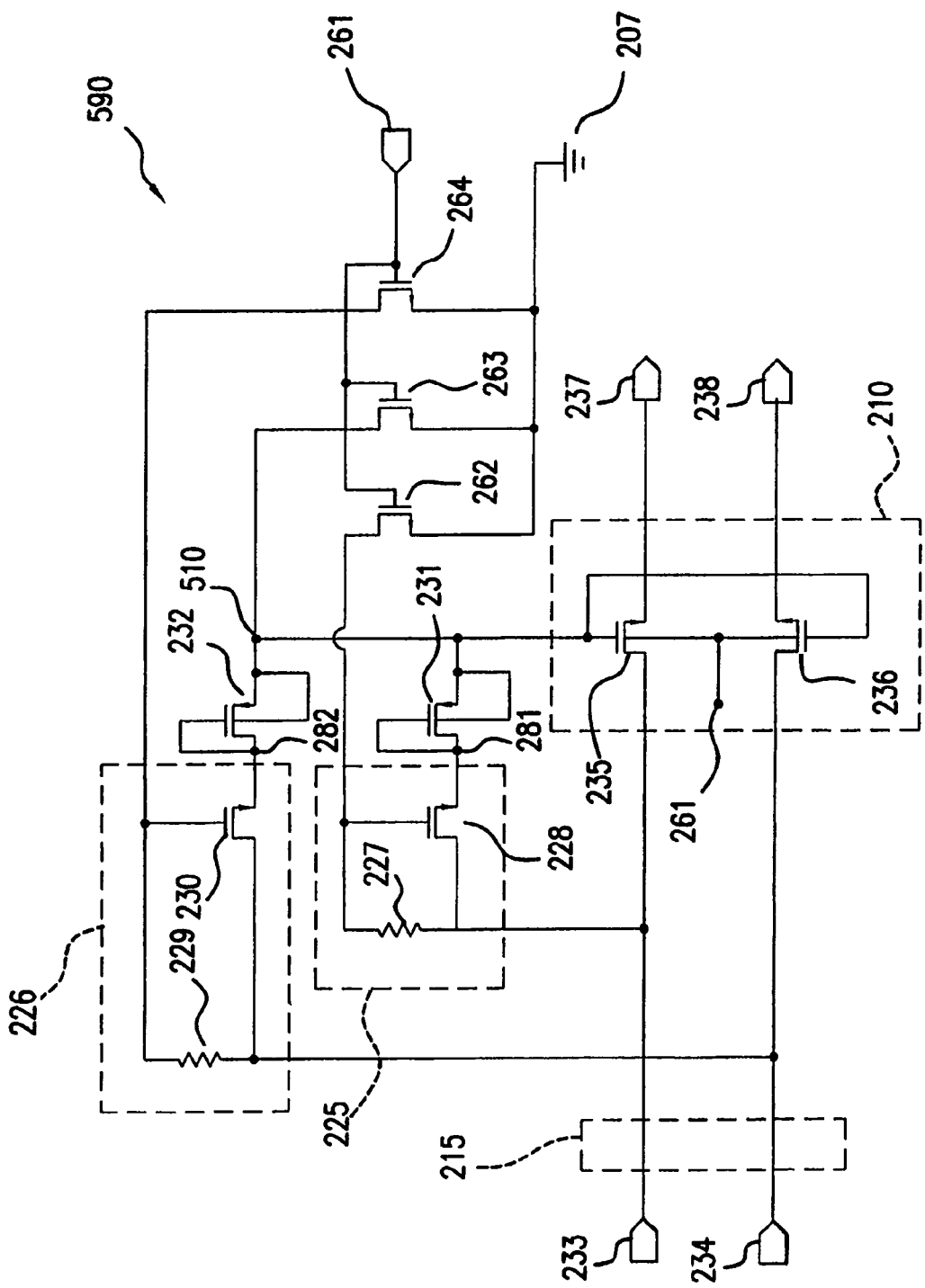
FIG. 5c illustrates another embodiment of the relay in the present invention.
Figure 5D:
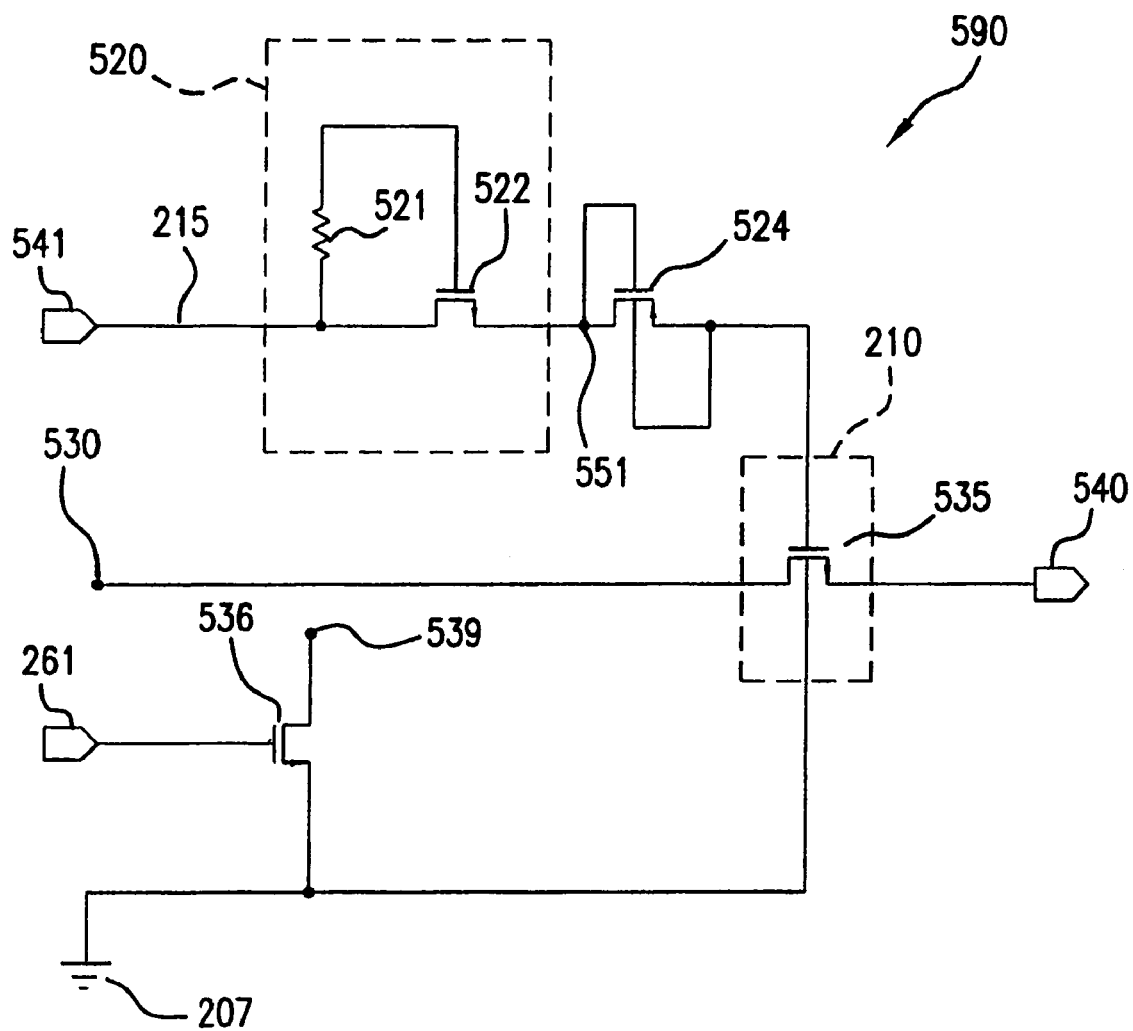
FIG. 5d illustrates yet another embodiment of the relay in the present invention.
Figure 5E:
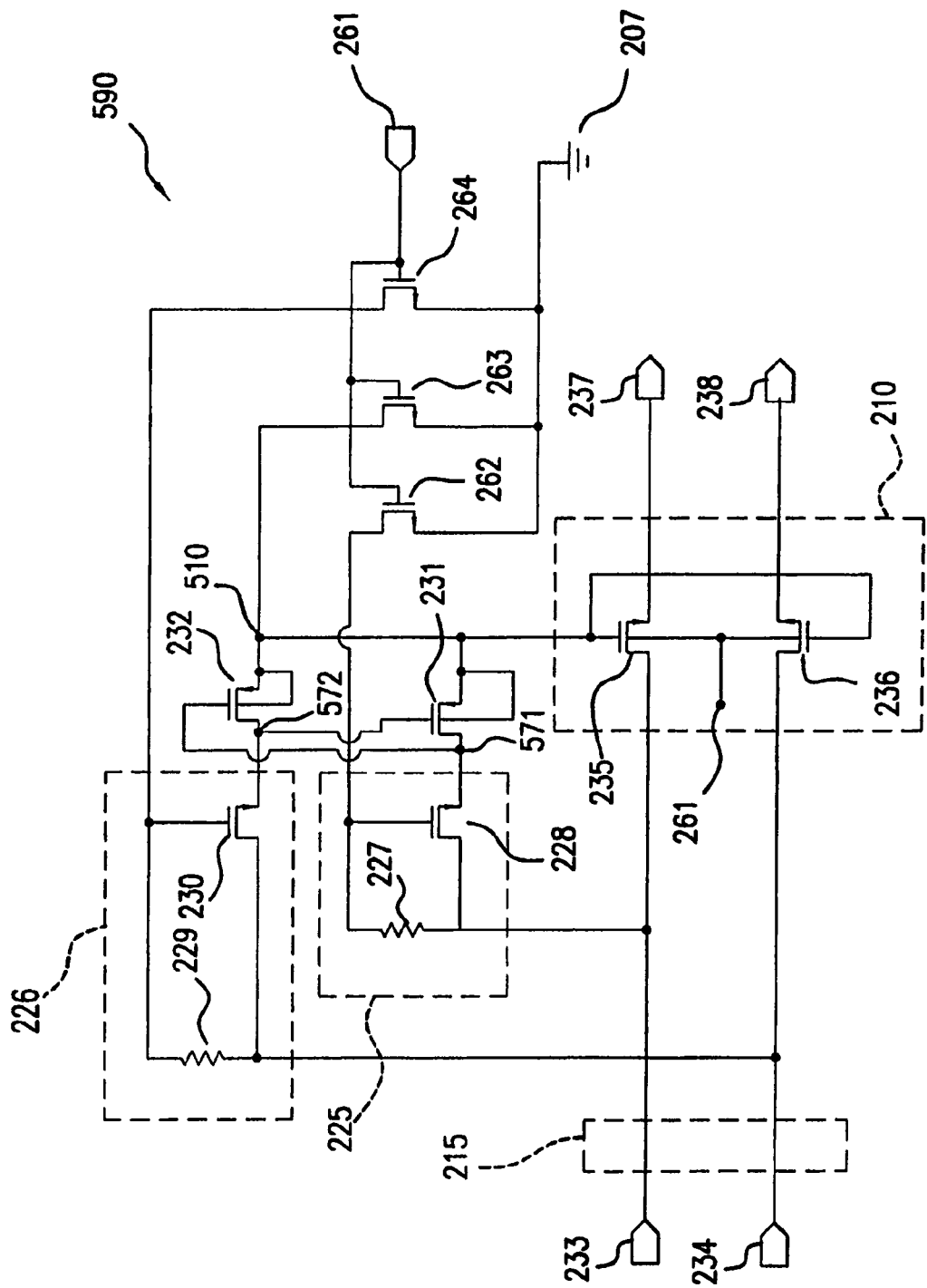
FIG. 5e illustrates yet another embodiment of the relay in the present invention.

FIG. 5e illustrates another embodiment of the relay portion 590, where PFET 231 and PFET 232 are cross-connected. More specifically, the gate of the PFET 231 is connected to the drain of the PFET 232 at node 572. Furthermore, the gate of the PFET 232 is connected to the drain of the PFET 231 at a node 571. This connection improves the operation of the rectifier circuits 226 and 225 during discovery mode. Since the input signal 215 is differential, one of the terminals 233 and 234 receives a positive voltage and the other terminal receives a negative voltage at any give time. By cross-connecting the PFETs 231 and 232, the VGS of at least one these PFETs will be positive at any given time, regardless of the current polarity of the input signal 215. Therefore, the PFETs 231 and 232 will turn on faster and stronger during the discovery mode than without the cross-connection.

Normal Operation Mode

After the signal is detected by the network 110 in the discovery mode, the IP telephone system 200 is placed in the normal operation mode, where a voltage source (typically on the order of 3V) is applied to the physical layer 208, including the input terminals 233, 234 and output terminals 237, 238. In the normal operation mode, the physical layer 208 is powered up, thereby opening the relay 210 and closing switch 205. Since, the filter 204 remains connected to the IP telephone system 200 during the normal operation mode, it is desirable to prevent any leakage of signals through the relay 210 to the transmit output 211 (FIGS. 2a and 2e). Therefore, the relay 210 is constructed as to not allow any signals pass through it to the network 110 during the normal operation mode (FIG. 2a).

In the normal operation mode (as described by FIG. 2e), an incoming signal 201 is terminated in a termination resistor 206 after being passed through the constant impedance filter 204, as shown in FIG. 2b. In the normal operation mode, the native devices 228 and 230 and output native devices 235 and 236 are grounded. Therefore, no signal passes through to the output terminals 237 and 238. The PMOS devices 231 and 232, which are turned off by application of voltage, cutoff the rectifier outputs of the rectifier circuits 225 and 226. The PMOS devices 231 and 232 serve to minimize a "leakage" of rectified signals through to the output native devices 235 and 236 during the normal operation mode. Because the gates of output native devices 235 and 236 are grounded and the sources and drains are held at supply voltage, no signal is able to pass through the relay 210, thereby opening relay 210 during the normal operation mode. Moreover, the series of gate grounding devices 262, 263, and 264 ground the gates of the output native devices 235 and 236.

Referring to FIGS. 2b and 5a, the gate grounding devices 262-264 are attached to power sources (an analog digital voltage source 261 and an analog digital ground 207) of the physical layer 208. Referring to FIG. 5a, during the normal operation mode, a voltage source is applied to terminals 261 to turn the gate grounding devices 262-264 on. This, in turn, grounds the gate connection 510 by shorting gate 510 to ground 207, thereby grounding the gates of the output native devices 235 and 236. Native devices 235 and 236 are cutoff by grounding of their respective gates. The gate grounding devices 262-264 are typically NMOS devices, however, other semiconductor devices may be substituted instead, depending on the particular requirements of a circuit.

Furthermore, referring to FIG. 5a, the PMOS devices 231 and 232 (which are attached to the native devices 228 and 230 in the rectifier circuits 225 and 226, respectively) are attached to the analog digital voltage source 261 of the physical layer 208. Therefore, in the normal operation mode, the devices 231 and 232 are raised to the level of potential applied to the physical layer 208, thus, cutting off the rectifier circuits 225 and 226 from the output native devices 235 and 236.

Since, the gates of native devices 228 and 230 and the output native devices 235 and 236 are grounded, and their respective sources and drains are held at supply voltage, no signal is capable of passing through the relay 210 (as was also described in reference to FIG. 2b). Any signal that passes through the constant impedance filter 204 is terminated in the termination resistor 206, as shown in FIG. 2b. In the IP phone 200, the only termination resistor outside the physical layer 208 is a resistor 212 connected between the transmitting output 213 and the physical layer output terminal 211. There is no termination resistor that is connected between the input terminal 202 and the receiving input 203. Therefore, the amplitude of the signal 201 is not reduced during discovery mode since the signal is not terminated prior to the filter 204. Furthermore, the on-chip termination 206 only becomes effective after power is applied during the normal operation mode. This can be referred to as a dynamic termination, since the on chip termination occurs only when the power is applied and the switch 205 is closed. Referring to FIG. 2b, the on-chip termination resistor 206 is shown in more detail. The structure consists of a pair of resistors 271 and 272 and a PMOS device 273 connected to an analog digital ground 207 of the physical layer 208.

With respect to the embodiment depicted in FIG. 5b, the relay 210 operates similarly in the normal operation mode as its embodiment described in FIG. 5a. The relay 210 has PMOS devices 524 (similar to devices 231 and 232 of FIG. 2b) connected to the analog digital voltage source 261 of the physical layer 208. The PMOS devices 524 ground the gates of the native devices 522 during the normal operation mode. Furthermore, to ensure non-conductivity of the relay the gate grounding devices 536 (which are connected to the digital analog voltage source 261 and the digital analog ground 207) ground a gate connection 539, thereby grounding output native devices 535 (similar to the gate grounding devices 262-264 with respect to the output native devices 235 and 236 in FIG. 2b).

The embodiments of the relay 210 shown in FIGS. 5c and 5d are similar in circuit architecture to the embodiments shown in FIGS. 5a and 5b, respectively. These embodiments should be considered together with respect to FIG. 2c (similar to the schematic shown in FIG. 2b). In case of the embodiment shown in FIG. 5c, the relay's PMOS devices 231 and 232 have additional connections 281 and 282, where connection 281 is a connection between the source of the native device 228 and the PMOS device 231 (similarly connection 282 is a connection of the source of 230 and the PMOS device 232). This embodiment, as well as embodiment shown in FIG. 5d, allows for lower return loss of the relay 210 during the normal operation mode. Similar source connections are made, as is shown in FIG. 5d, where the source of the native device 522 is connected to the PMOS 524 at connection 551.

There are other embodiments of the relay are possible, however, these are some of the embodiments and not to be construed as limiting the scope of the invention, except by the following claims.

Constant Impedance Filter

Figure 3A:
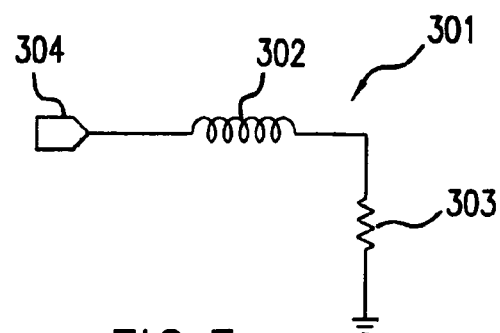
FIG. 3a. illustrates a conventional low pass RL filter.

Filters are commonly used to prevent unwanted frequencies from passing to communication devices. For example, a conventionally known low pass filter consists of an inductor connected in series with a resistor. Referring to FIG. 3a, a low pass filter 301 (an RL filter) is shown to have an inductor 302 connected to a resistor 303, which is grounded. One problem with the lowpass filter 301 is that the input impedance of the filter 301 is a function of frequency, as illustrated by the equations (1) and (2) below:

$$Z = R + sL \tag{1}$$

$$|Z| = \sqrt{R^2 + (\omega L)^2} \tag{2}$$

wherein Z is the input impedance of the filter; R is resistance of the resistor 303; ω is angular frequency; and ωL is inductive reactance of the inductor 302. As shown by equations (1) and (2), the input impedance of the lowpass filter 301 varies with frequency. The variable input impedance causes a variable return loss, which can decrease signal performance if there is a need for constant impedance circuitry.

Figure 3B:
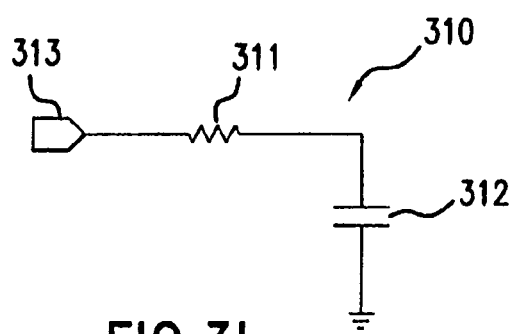
FIG. 3b illustrates a conventional low pass RC filter.

As illustrated in FIG. 3b, another low pass filter 310 is shown to have a resistor 311 connected to a capacitor 312 (a single pole). Low pass filter 310 also has impedance that varies with frequency as presented by equations (3) and (4):

$$Z = R + \frac{1}{sC} \tag{3}$$

$$|Z| = \sqrt{R^2 + \left(\frac{1}{\omega C}\right)^2} \tag{4}$$

wherein C is the capacitance, R is resistance, ω is angular frequency, and $$\frac{1}{\omega C}$$

is capacitive reactance. As with the RL filter, the impedance of filter 310 varies with frequency, producing a variable return loss with frequency.

Figure 3C:
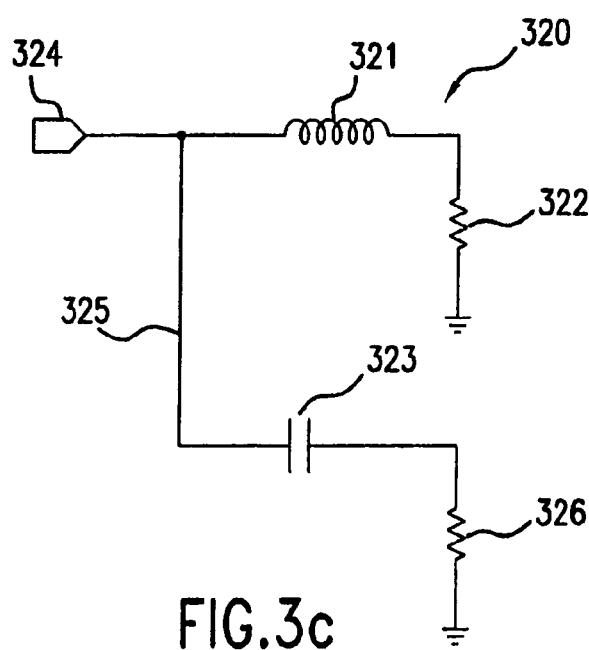
FIG. 3c illustrates a low pass and a high pass filter.

FIG. 3c illustrates a low pass and a high pass filter 320 that has a constant impedance at all frequencies. Filter 320 includes an inductor 321 that series connected with a resistor 322. Inductor 321 and resistor 322 are further connected in parallel to a capacitor 323 that is series connected with resistor 326. This filter 320 is capable of maintaining the following relationship for substantially all frequencies:

$$Z = R \tag{5}$$

wherein Z is the input impedance and is a pure resistance R. In embodiments, R is the resistance of the resistors 322 and 326, or a parallel combination thereof. The impedance in equation (5) is derived from equations (6) and (7) that are recited below:

$$Z = \left\{ (R + sL)^{-1} + \left(R + \frac{1}{sC}\right)^{-1} \right\}^{-1} \tag{6}$$

$$C = \frac{L}{R^2} \tag{7}$$

The filter 320 is only a one pole solution. A single pole may not provide enough attenuation and therefore may allow some unwanted frequencies to pass through the filter.

FIG. 3d illustrates a lowpass Butterworth filter 330. The filter 330 is a passive LC filter comprising of multiple poles (LC circuit groups). In one example, the Butterworth filter 330 is a 5-pole filter, wherein a pole includes an inductor 335 and a capacitor 336. The filter attenuation outside the passband of the filter 330 increases with the number of poles in the filter 330. However, as the number of poles in the Butterworth filter 330 increases, the filter response becomes more sensitive to component variations.

The impedance of the Butterworth filter 330 varies with frequency. Within the filter passband, the impedance of the filter is matched and the signals pass through. However, outside the passband, the impedance is high and the filter becomes totally reflective. A Butterworth filter can be configured in a low pass, high pass, and a band pass variety.

FIGS. 4a-4e describe a constant impedance filter having multiple poles according to the present invention. A constant impedance filter maintains a constant input impedance through the filter for frequencies that are both inside and outside the filter passband. In other words, frequencies inside and outside the filter passband see a substantially matched impedance. Frequencies that are inside the filter passband are passed to the filter output. Frequencies that are outside the filter passband are terminated inside the filter, and are not reflected.

FIG. 4a illustrates the function of a filter 204 according to the present invention. The filter 204 receives an input signal 202 having multiple frequency components. The filter 204 terminates unwanted frequencies 492 from the input signal 202 into a matched impedance 412, and passes the desired frequencies 211 to the filter output 212. The input impedance for the filter 204 is constant for substantially all frequencies, including those frequencies that are outside the filter passband. In other words, the input impedance of the filter 204 appears to be completely resistive.

Figure 4B:
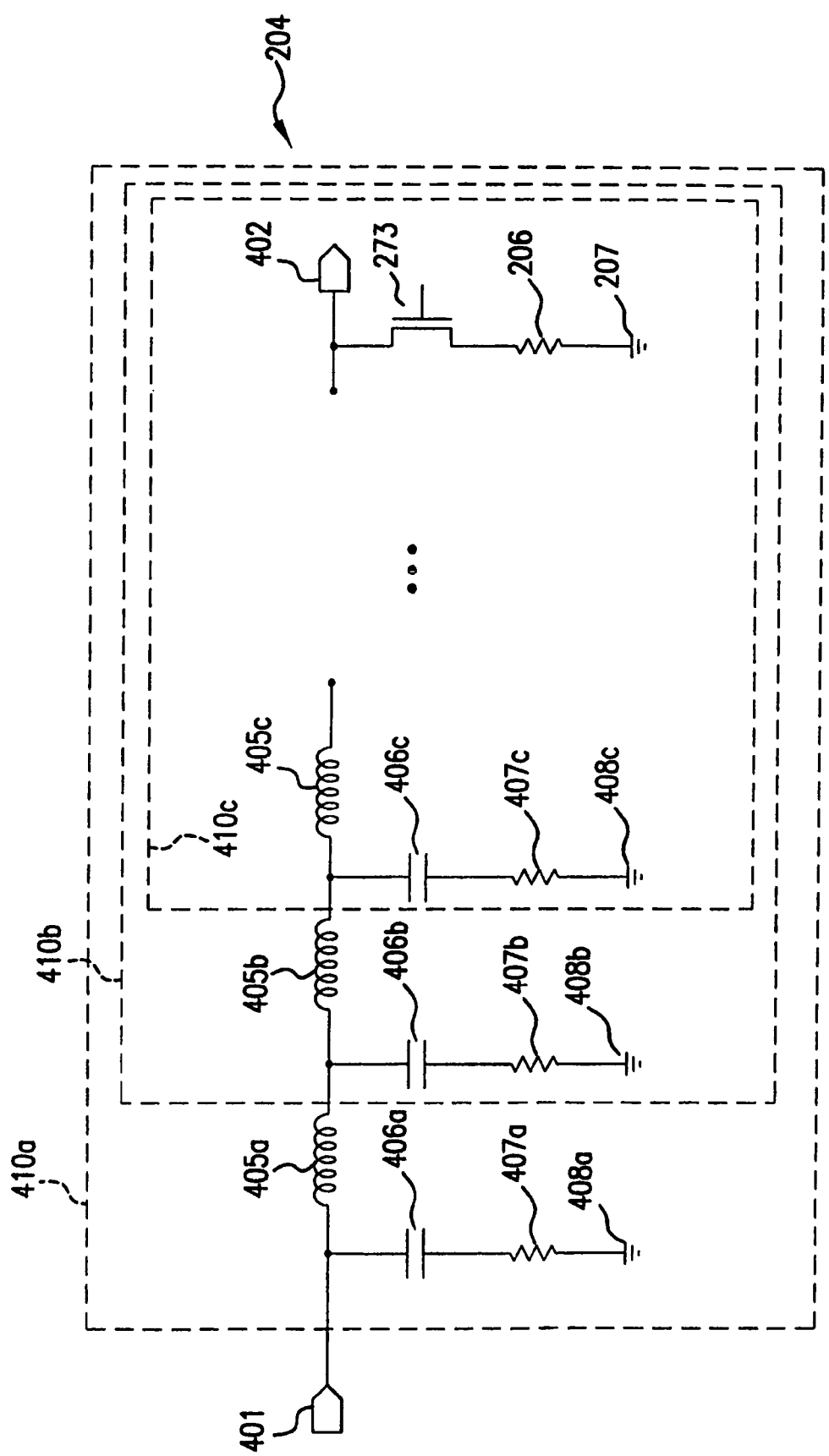
FIG. 4b illustrates a multi-pole constant impedance low pass filter, according to embodiments of the present invention.

FIG. 4b illustrates a constant impedance lowpass filter 204 according to embodiments of the present invention. The filter 204 includes a plurality RLC circuit units or poles 410a, 410b, 410c, etc., that are connected in series with each other. Each RLC circuit unit 410 includes an inductor 405, a capacitor 406, and a resistor 407 and a ground 408, along with a plurality of other poles 410 ending with the termination resistor 206 and the PMOS relay device 273 (as described in FIG. 2b). For instance, a pole 410a will include an inductor 405a, a capacitor 406a, a resistor 407a, a ground 408a, and the plurality of poles 410 (such as 410b, 410c, etc.) along with the termination resistor 206 and the PMOS device 273. The input signals come through the input terminals 401 and are filtered through the chain of the RLC circuits 410, to an output 402. The termination resistor 206 is connected between the PMOS relay device 273 (which is connected to the output 402) and the ground 207.

The filter poles 410 in the filter 204 provide a constant input impedance regardless of frequency, if equations (5)-(7) is satisfied. More specifically, the input impedance of each pole 410 is equal to the resistance of the respective resistor 407, as long as the capacitance 406 and inductor 405 are chosen according to the relationship in Equation 7. As a result, the filter 204 appears as a pure resistor to the incoming signal. Frequencies that are outside the passband of the filter 204 are terminated in a matched impedance, and are not reflected. Frequencies that are inside the passband of the filter 204 are passed to the output 402.

The angular frequency cutoff of each pole may be determined by the following relationship:

$$\omega = R/L \qquad (8)$$

where, $\omega = 2\pi f$.

Each pole 410 can have the same frequency cutoff or each pole 410 can have a different cutoff frequency, depending on the specification of devices connected to the filter. If different cutoff frequencies are selected, then the effect of each pole 410 is cascaded over another pole 410. Nonetheless, the filter 204 would appear as a constant impedance filter across all frequencies as long the equations (5)-(7) are satisfied.

For a desired cutoff frequency and input impedance (which determines R), the values for L and C for each pole 410 can be calculated by solving equations 7 and 8. For example, if the desired input impedance is 100 ohm and the desired cutoff frequency is 2.274 MHz for a pole 410, then L is found using equation 8 and C is found using equation 7, where L is 7.0 uH and C is 700 pF.

As stated above, the cutoff frequencies of each pole 410 can be selected to be same, or the cutoff frequencies can be different in for each pole 410 in the filter 204. Additionally, the resistors 407 can be identical for each pole 410 in the filter 204, or the resistors 407 can vary from one pole 410 to another pole 410. If the resistors vary from pole to pole, then input impedance at 401 is the based combination of the resistors 407 in each pole 410 and the termination resistor 206, assuming that equations (5)-(7) are satisfied in each pole.

In one embodiment, the resistor 407 is the same for each pole 410 and is equal to the termination resistor 206. In this embodiment, the input impedance at the terminal 401 is the resistance of the resistor 407, assuming equations (5)-(7) are satisfied.

Referring to FIG. 2b, the termination resistor 206 is configured using resistors 271 and 272 and a PMOS relay device 273 that is connected to ground terminal 207. The resistors 271 and 272 are connected across the terminals 233 and 234 when the PMOS relay 273 is closed. The resistors 271 and 272 provide a termination for the filter 204 when applied across the terminals 233 and 234. During discovery mode, no voltage is applied to the physical layer 208, so the terminal 207 is allowed to float open and the resistors 271 and 272 are not applied across the terminals 233 and 234. Therefore, the filter 204 is not terminated during the discovery mode, as represented by the open relay 205 in FIG. 2d. In the normal operation mode, a ground voltage is applied at terminal 207 to the gate of the PMOS device 273, causing the PMOS device to conduct and apply the resistors 271 and 273 across the terminals 233 and 234. Therefore, the filter 204 is properly terminated during the normal operation mode, produce the desired constant impedance across all frequencies. Furthermore, in the normal operation mode, any signal that comes through the filter is terminated in the resistors 271 and 272 since the PMOS device 273 is closed and the relay 210 is open. The signal is analogously terminated in the following embodiments of the filter 204.

Figure 4C:
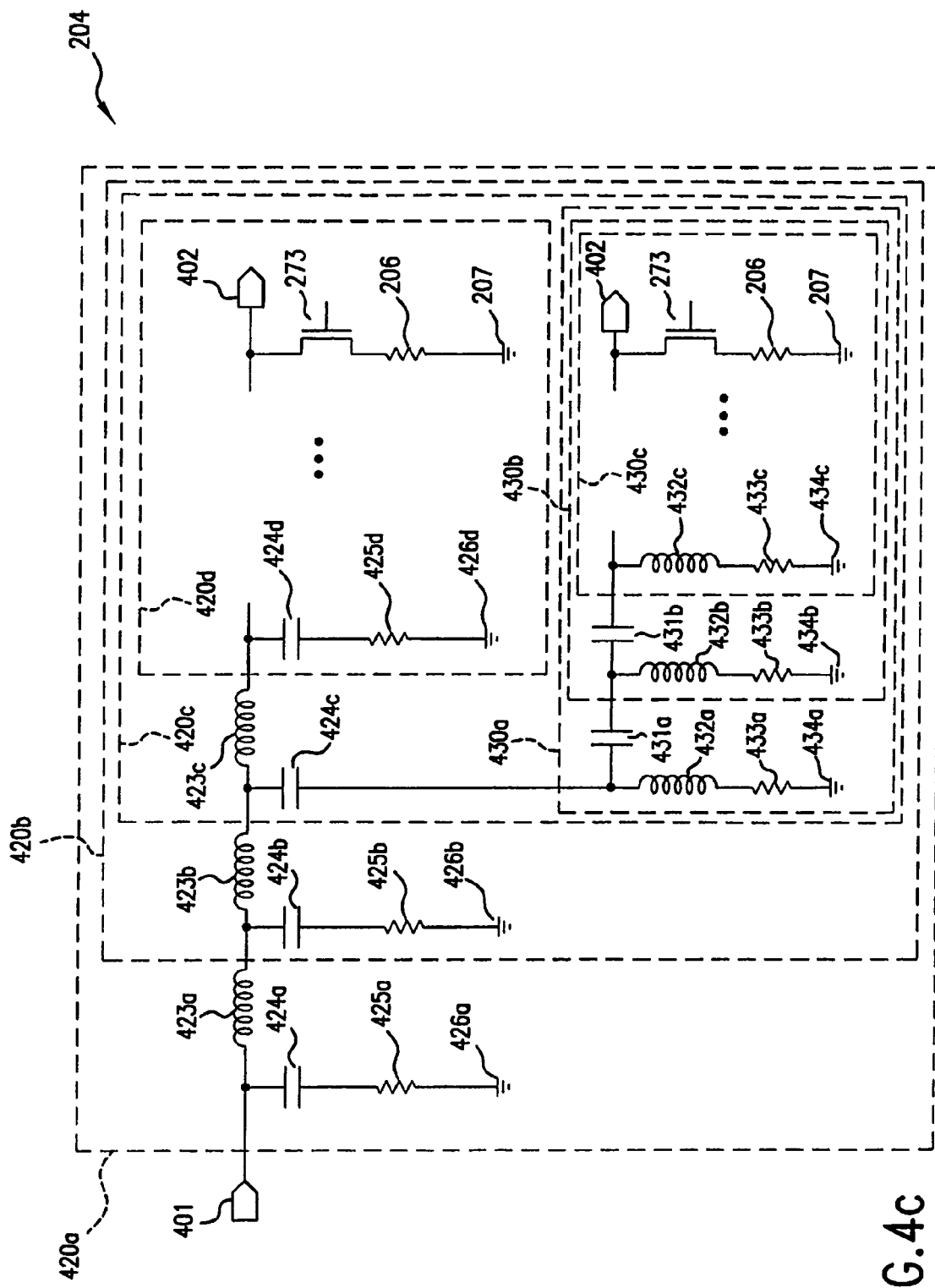
FIG. 4c illustrates a multi-pole constant impedance bandpass filter, according to embodiments of the present invention.

FIG. 4c illustrates a bandpass filter 204 that has a constant input impedance. Referring to FIG. 4c, the input signals come in through an input terminal 401 encountering a series of RLC circuit units or poles 420 (a, b, c, etc.). Each pole 420 includes an inductor 423, a capacitor 424, and a resistor 425 and a ground 426, along with a plurality of other poles 420 ending with a termination resistor 206. For instance, a pole 420a will include an inductor 423a, a capacitor 424a, a resistor 425a, a ground 426a, along with a plurality of poles 420 (such as 420b, 420c, etc.) that end with the termination resistor 206 and the PMOS relay device 273. The chain of RLC poles 420 ends with the termination resistor 206, the PMOS relay device 273 and the ground 207. In the pole 420c, the resistor (not shown) is removed leaving only the capacitor 424c (as shown). A chain of highpass circuits or poles 430 (a, b, c, etc.) are attached to one terminal of the capacitor 424c, so as to be in parallel with the lowpass poles 420. Therefore, the lowpass poles 420a, 420b, and 420c includes a plurality of lowpass poles 420 and the plurality of highpass poles 430 along with respective termination resistors 206 and the PMOS relay devices 273. Subsequent lowpass poles 420 (i.e., 420d, 420e, etc.) include only the plurality of lowpass poles 420 and not the plurality of highpass poles 430. It is clear, that the plurality of highpass poles may be attached to the plurality of lowpass poles at any given lowpass pole 420. Each highpass pole 430 includes an inductor 432, a capacitor 431, and a resistor 433 and a ground 434 along with a plurality of other poles 430 ending with the termination resistor 206 and the PMOS relay device 273. For instance, a pole 430a will include an inductor 432a, a capacitor 431a, a resistor 433a, a ground 434a, and the plurality of poles 430 (such as 430b, 430c, etc.) along with the termination resistor 206 and the PMOS device 273. The filter 204, shown in FIG. 4c, has a bandpass response determined by the lowpass cutoff frequency of the poles 420, and by the highpass cutoff frequency of the poles 430. The cutoff frequency of the lowpass poles 420 and the highpass poles 430 are determined by the equation 8. As in FIG. 4b, the inductor and capacitors in the lowpass poles 420 and the highpass poles 430 can be selected to provide a constant input impedance for each pole 420, 430 by satisfying Equation (5)-(7). If the lowpass poles 420 and the highpass poles 430 are selected to have the same constant input impedance, then the input impedance of the at the terminal 401 will have the selected input impedance.

Figure 4D:
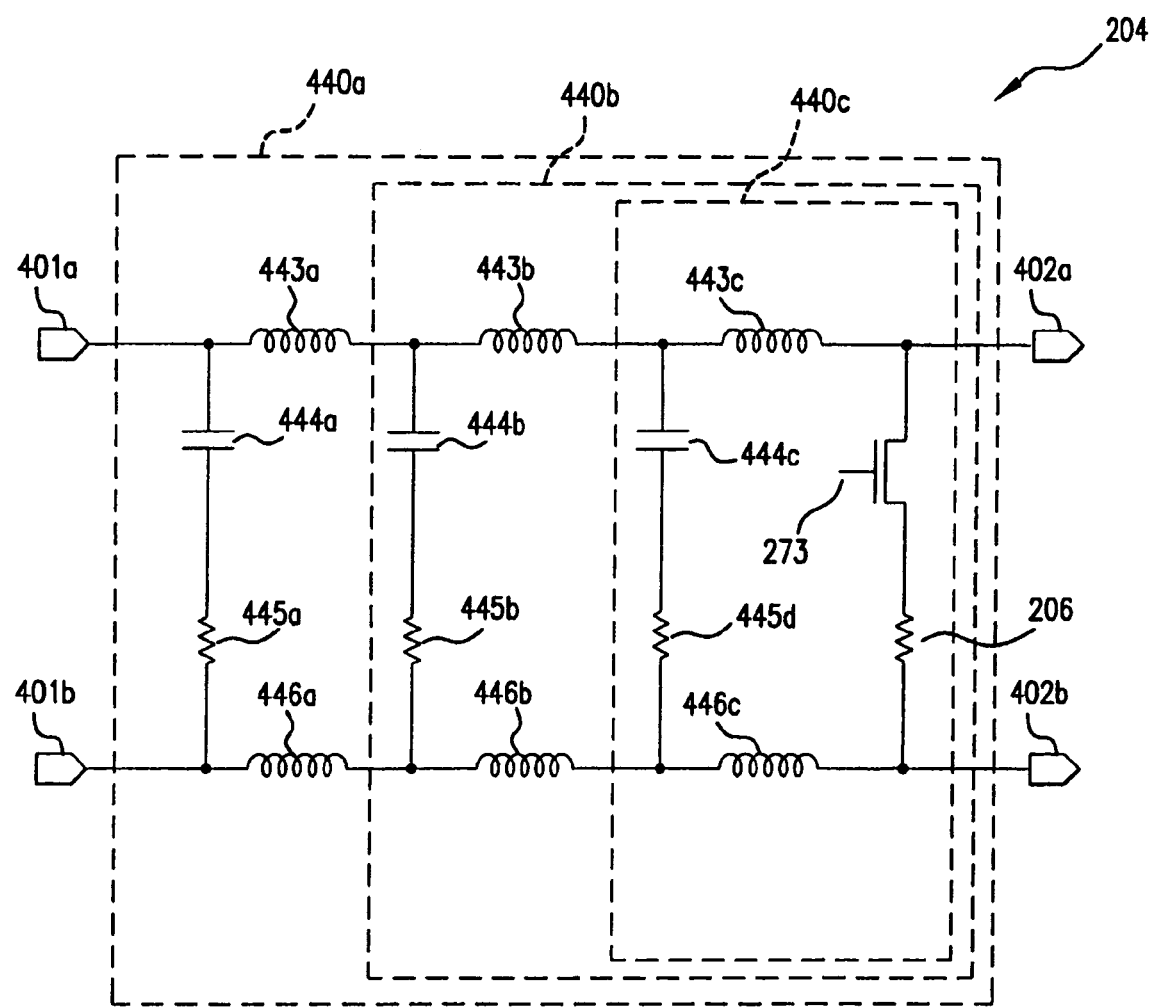
FIG. 4d illustrates a multi-pole constant impedance differential low pass filter, according to embodiments of the present invention.

FIG. 4d shows a differential lowpass filter 204 that has a constant impedance according to embodiments of the present invention. The filter 204 includes a plurality RLC circuit units or poles 440a, 440b, 440c, etc., that are connected in series with each other between an input 401 and an output 402. Each pole 440 includes a first inductor 443, a second inductor 446, a capacitor 444, a resistor 445, along with other poles 440 that end in the termination resistor 206 and the PMOS relay device 273. The input signals come through input terminals 401a and 401b, wherein terminal 401a can serve as an input means for a positive differential component and input terminal 401b may serve as an input means for a negative differential potential. The output of the filter 204 is taken across output terminals 402a and 402b. The termination resistor 206 and the PMOS relay device are connected across the output terminals 402. As with the filters 204 shown in FIGS. 4b and 4c, each pole 440 maintains a constant impedance to an incoming signal, if the inductors 443, 446 and the capacitor 444 satisfy equations (5)-(7). When using equations 7 and 8, the calculated inductor values are divided by 2, and assigned to the inductors 443 and 446. For example, if the inductor value is calculated to be 7.0 uH from equations 7 and 8, then the inductors 443 are set to 3.5 uH and the inductors 446 are set to 3.5 uH.

Figure 4E:
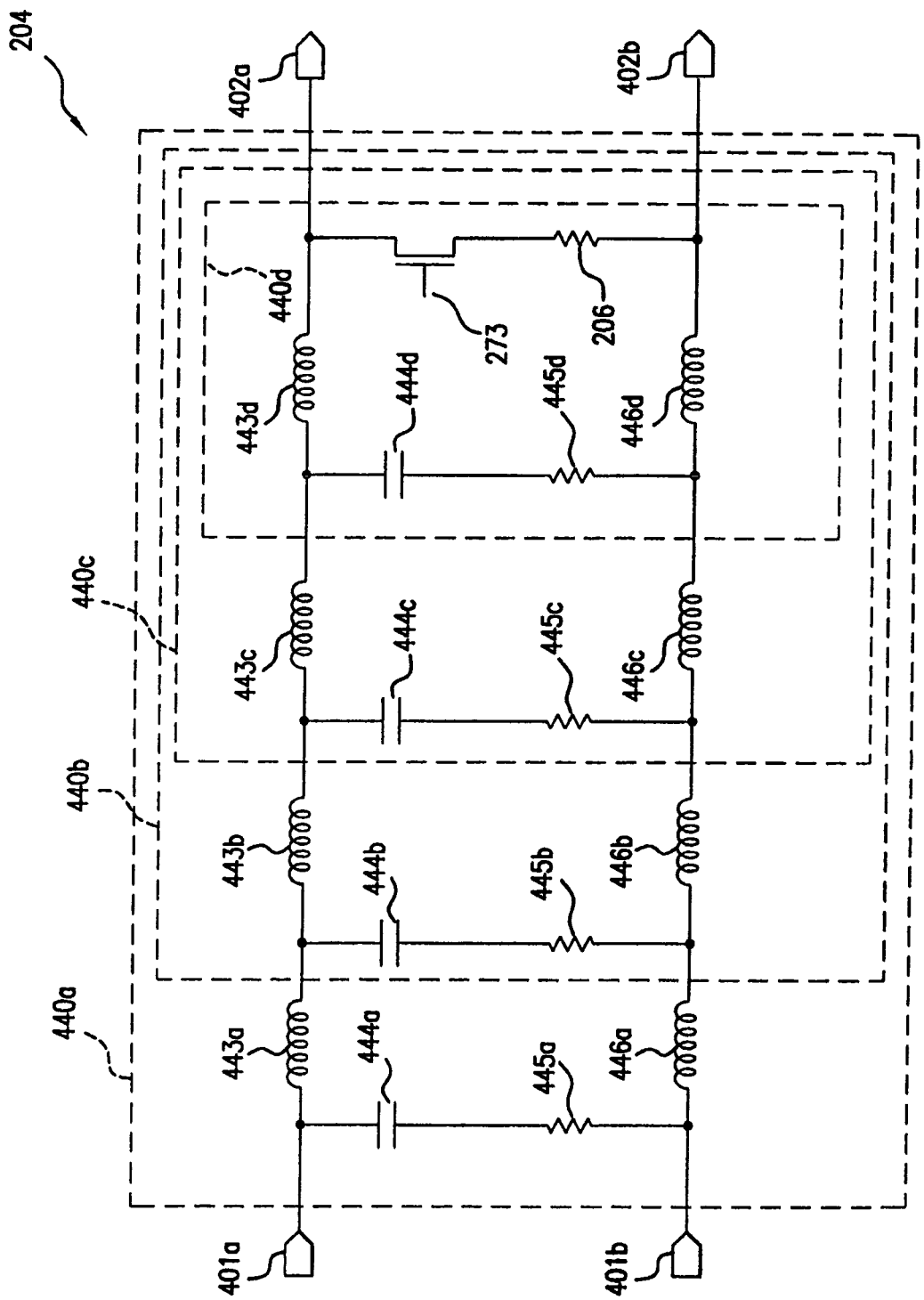
FIG. 4e illustrates a second multi-pole constant impedance differential low pass filter, according to embodiments of the present invention.

Filter 204 is illustrated to have 3 poles. However, any number of filter poles could be utilized. For example, filter 204 in FIG. 4e has four RLC poles 440 (a, b, c, d) connected in series between the input 401 and the output 402. Each pole 440 includes the first inductor 443, the second inductor 446, the capacitor 444, the resistor 445, along with other poles 440 that end in a termination resistor 206 and the PMOS relay device 273. Filter 204 of FIG. 4e is also a differential filter as is the one shown in FIG. 4d. An input differential signal comes in through terminals 401a and 401b and passes through each individual pole 440 (a, b, c, d). The incoming signal after being filtered through each individual pole, is terminated in the termination resistor 206.

The values of each of the resistors 445 in both FIGS. 4d and 4e may differ as well as the values of inductors 443 and 446 and capacitors 444. However, the filters 204 of FIGS. 4d and 4e will have a constant input impedance as long as the relationship described by formula (7) is substantially maintained within each individual pole. Each pole in all of the embodiments of the present invention filter is independent of another pole, which makes the filter more advantageous over conventional filters. It is understood by one skilled in the art that the present invention is not limited to the embodiments shown in FIGS. 4a-4e, as other arrangements will be apparent to those skilled in the art based on the discussion given above. In embodiments of the invention, the filters described herein have at least two poles in order to avoid sensitivity of components in the filter.

The differential filters shown in FIGS. 4d and 4e have a better noise reduction parameters than single-ended filters, shown in FIG. 4b and 4c. The values of the elements comprising the poles 440 do not need to be the same, i.e., resistor in one pole does not need to be equal to the resistor in another pole. Nonetheless, as long as the relationship in equation (7) is preserved, each pole is independently preserving constant impedance through the entire chain of the poles.

The constant impedance of the present invention filter allows the filter to be connected to other circuitry at all times, without regard for unwanted signal reflections. For example, the present invention filter can be connected to the physical layer of an IP telephone system at all times. This is an advantage over the conventional filter, which utilizes off-chip relays to connect/disconnect the conventional filter to/from the physical layer, depending on the mode of operation. Since the present invention filter is connected at all times, this alleviates the connecting/disconnecting of the filter when the system changes its modes.

In one embodiment of the present invention, the values of the components of the filters 204 of FIGS. 4d and 4e may be as follows. The resistors 445 are of 100 ohm each. The capacitors 444 are of 700 pF each. The inductors 443 and 446 are of 3.5 u each. The mentioned vales will produce a constant input impedance of approximately 100 ohms at the input of the filters 204 of FIGS. 4d and 4e, according to equation (7). These values are provide for example purposes only, and are not meant to be limiting. Other filter component values will apparent to those skilled in the arts based on the discussion given herein.

Since, the filter poles are independent of one another, one can construct the filters according to a band of frequencies supplied to it. For example, if it is desired to have a filter accepting only 1 MHz frequencies, then all poles would have a 1 MHz passband response. If it is desired that the filter would have a gradual response to a range of 1 MHz to 10 MHz, each pole may have a different passband response according to the range.

Figure 6:
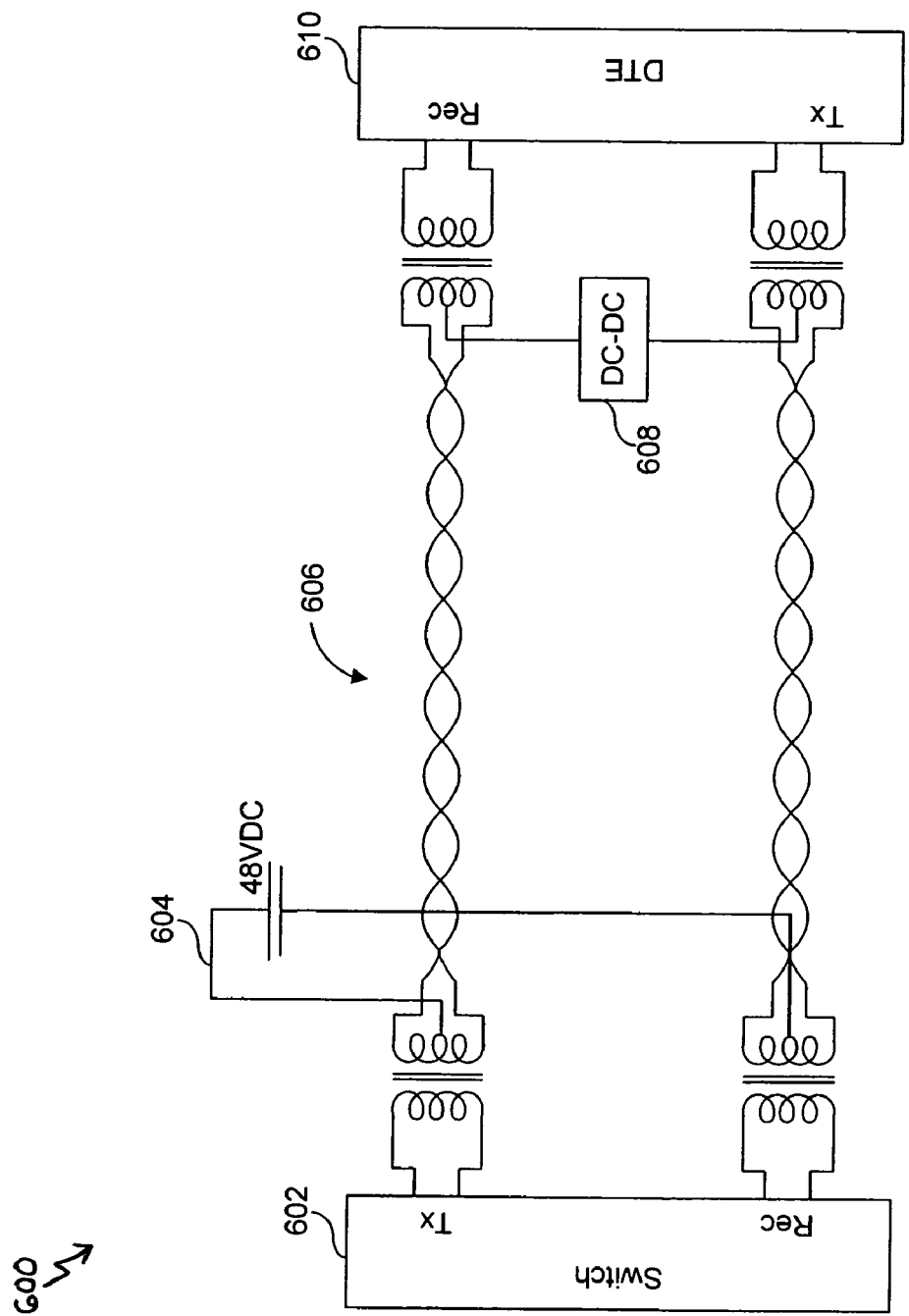
FIG. 6 illustrates a communications system having power provided over a LAN to an IP phone.

FIG. 6 illustrates a communications system 600 having a switch 602 that is coupled to a DTE 610 over a LAN 606, wherein power 604 is applied to over the LAN 606 to the DTE device 610 using a DC-DC converter 608. The DTE device 610 is preferable an IP phone, wireless access point, or other device that can be properly powered by the power supply 604. Legacy devices cannot be powered by the power supply 604 and therefore should be shielded from being powered by the power supply 604. For example, legacy network interface cards (NICs) can be permanently damaged if the power 604 is applied over the LAN 606. Further, legacy devices may also cause a fire hazard if improperly connected to a power supply. Accordingly, it is highly desirable to determine if the DTE is a conforming network device (i.e. non-legacy device) prior to applying power to over the LAN. Herein the term "conforming network device" for a DTE includes, for example, an IP Phone that is configured to be powered over a LAN. However, "conforming network devices" are not limited to IP phones, but also include other devices that are intended to be powered over a LAN, such as wireless access points, small switches, and other devices etc. A particular DTE is determined to be a conforming device or legacy network (i.e. communications) device during the discovery mode.

Figure 7:
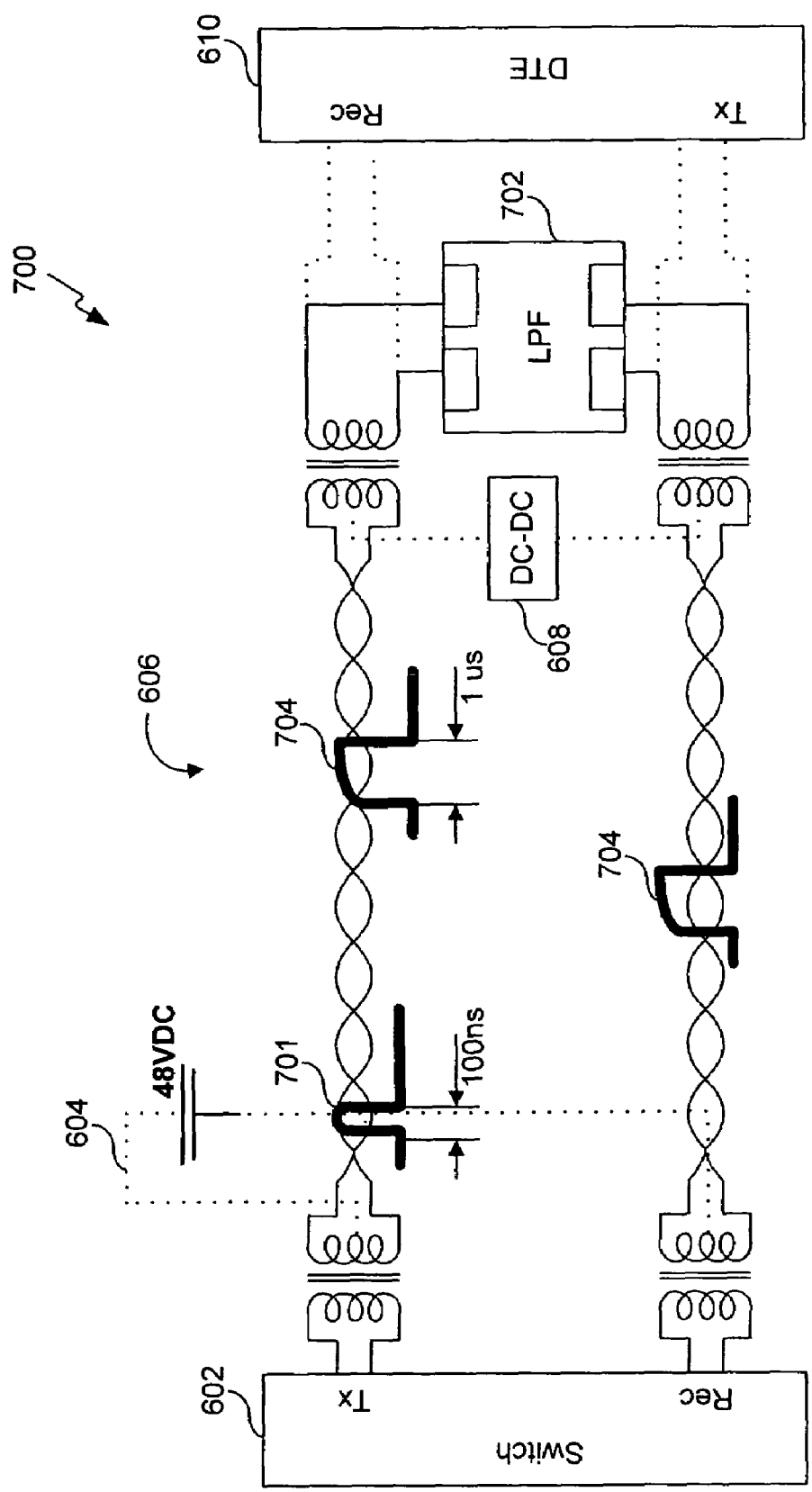
FIG. 7 illustrates a discovery mode of a communications system having normal link pulses and extended link pulses, and a filter coupled across the substrate terminals.

FIG. 7 illustrates a communications system 700 that is similar to the communications system 600, but includes a filter 702 that is intended to prevent legacy devices from being interpreted as IP phones by the switch 602 during discovery mode. The switch 602 transmits normal link pulses 701 for legacy devices, but transmits extended link pulses 704 for IP phones. For example, the normal link pulses 701 could be 10Base-T or 100TX pulses, and the normal link pulses 701 are higher frequency than the extended link pulses 704. The lowpass filter 702 is configured to block normal link pulses 701 but passes extended link pulses 704 so that they are returned to the switch device 602, indicating the presence of an IP phone at the DTE 610. This occurs because the frequency spectrum of the normal link pulses 701 is higher than that of the extended link pulses 704, and the cutoff frequency of the lowpass filter 702 is configured to reject the normal link pulses but pass the extended link pulses. The communications system 700 requires four relays because the filter 702 is coupled across the transmit and receive ports of the DTE 610 for discovery mode. However, once discovery mode is concluded, the four relays are opened so that that the filter is disconnected for normal operation to begin. During normal operation, the TX and REC ports of the DTE are operational. As discussed above, the filter relays can often wear over time, increasing repair costs. Additionally, the filter is an external device which increases assembly time and costs.

Figure 8A:
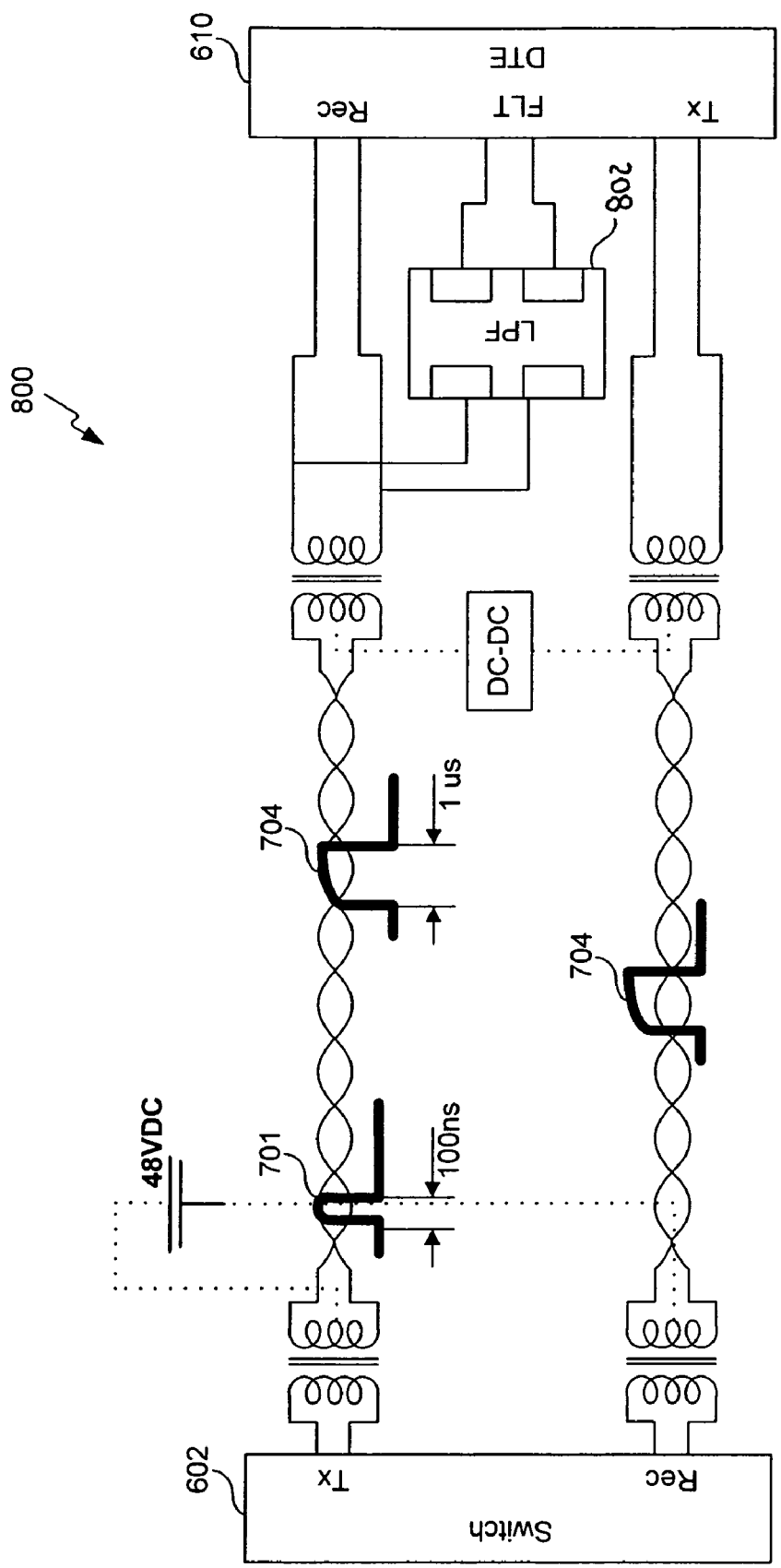
FIG. 8A illustrates further illustrates a discovery mode of a communications system and having a filter coupled to the filter input of the physical layer device.

FIG. 8A illustrates a communications system 800 that is similar to the communications system 700, but the lowpass filter 802 is connected all the time and is connected to a filter node of the DTE 602. The lowpass filter 802 is configured to block normal link pulses 701 but pass extended link pulses 704 so that they are returned to the switch device 602, indicating the presence of an IP phone at the DTE 610 during discovery mode. The relay in DTE 610 is open during normal mode operations, similar to the discussion of FIGS. 2A-2D. In other words, the communications system 800 represents the IP phone discussed in FIGS. 2A-2D, where the rely 210 is closed and the switch 205 is open during discovery mode.

A problem can occur with the communications system 800 if the low pass filter 802 does not sufficiently attenuate the normal link pulses 701. This can occur for example when switch 602 is a legacy switch that is sending normal link pulses over a short cable and the pulses are not sufficiently attenuated by the low pass filter 802. In which case, the switch 602 may receive normal link pulses 701 that are inadvertently passed by the IP phone, causing the switch 602 to interpret the IP phone as a legacy device instead of a non-legacy device. In other words, the devices can link up. If the legacy switch then transmits data packets over the LAN, then these data packets can also pass through the filter 702, creating an unintended and unauthorized signal loop that violates IEEE standards.

Figure 8B:
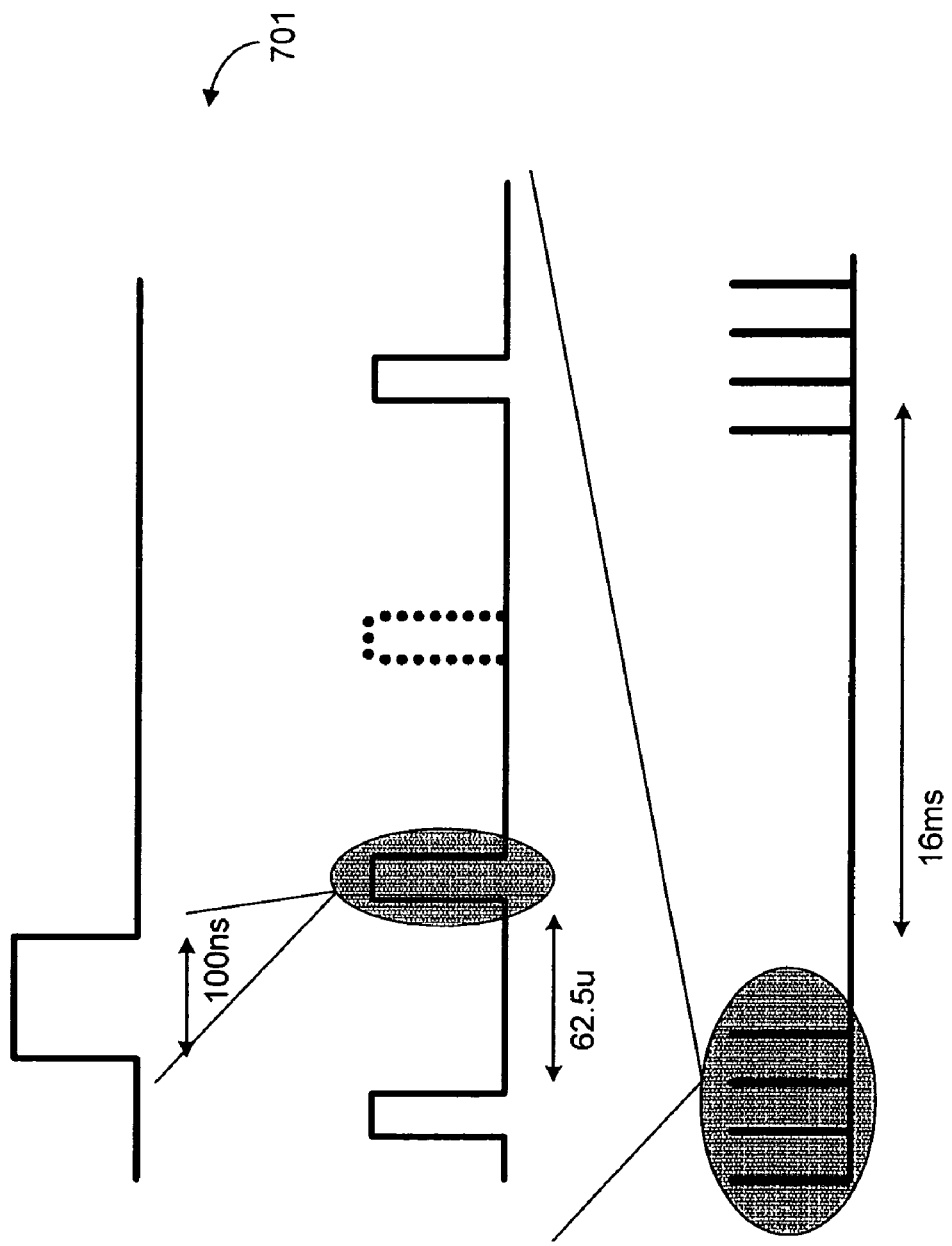
FIG. 8B further defines the extended link pulses 701.
Figure 8C:
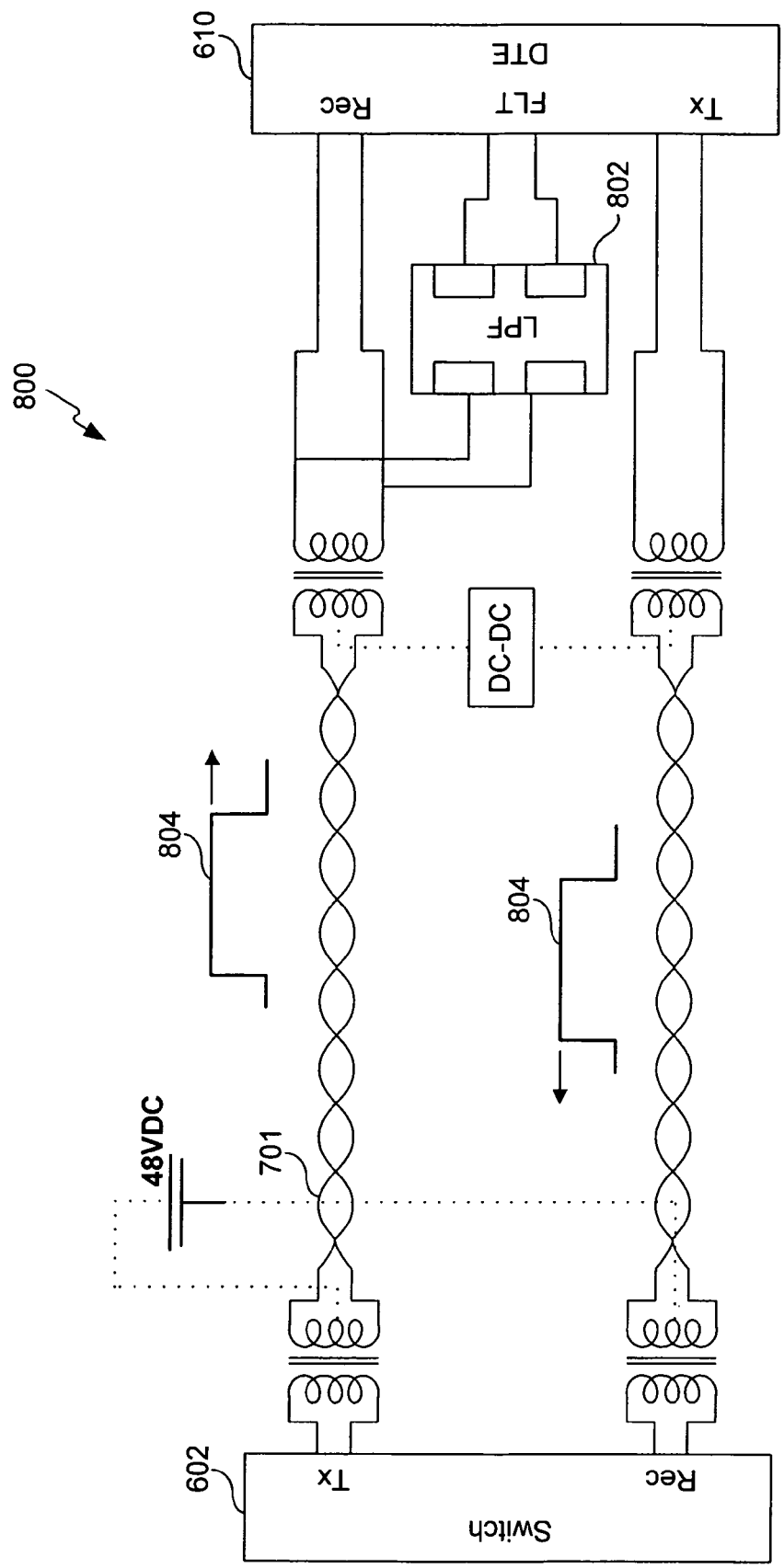
FIG. 8C illustrates data packets in a LAN environment.

FIG. 8B further illustrates the normal or fast link pulses 701, which are 100 ns wide pulses with a period of 16 mS. Extended link pulses that are associated with IP phones are larger, but are much less continuous than the normal link pulses. For example, extended link pulses can be between 150 nS wide to 1000 nS wide, but with a much lower period than the normal link pulses. Further, FIG. 8C illustrates data packets 802 for comparison, which are a much longer duration signal than both normal link pulses and extended link pulses. For example, but without limitation, data packets can be 1-3 microseconds long. Accordingly, data packets put much more energy on the LAN cable than either extended link pulses or normal link pulses because the signal is active for a longer period of time. Herein, data packets can be described as a "high duration signal", a "high time duration signal", a "long duration signal", a "long time duration signal" to describe the distinction relative extended link pulses and normal link pulses. The data packets can also be described as having a signal profile that has a "longer active period" than that of the extended link pulses and the normal link pulses because the data transmission last 1-3 microseconds. As such, the active signal period is one or two orders of magnitude higher than that of the normal link pulses and the extended link pulses.

Figure 9:
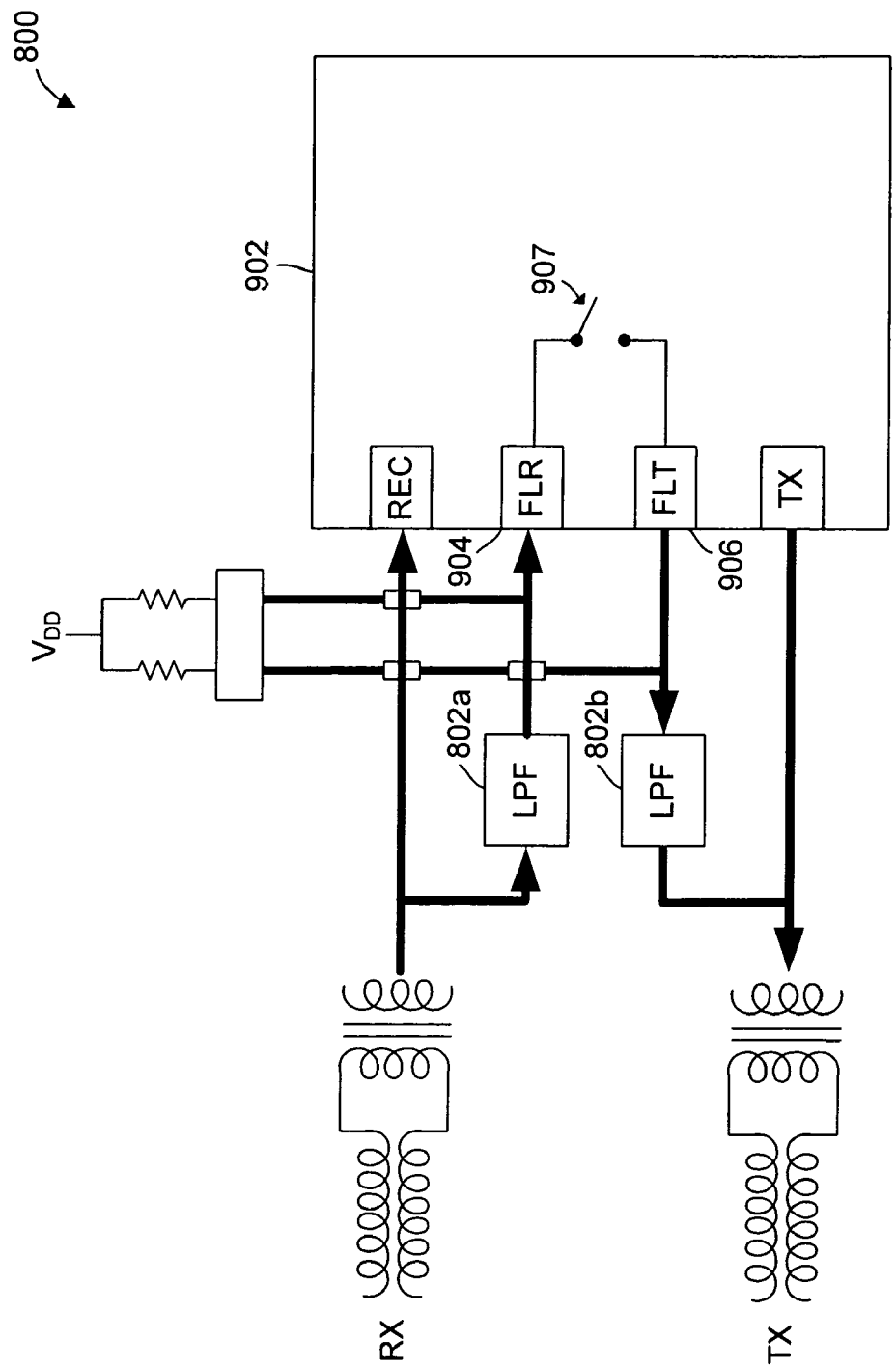
FIG. 9 further illustrates a physical layer device during discovery mode.

FIG. 9 further illustrates the communications system 800 during discovery mode. FIG. 9 includes a physical layer 902 of the DTE device 610 in the communications system 800. The physical layer 902 includes filter pins 904 and 906 that are coupled to the low pass filters 802. Low pass filters 802 are intended to block normal link pulses 701 and data packets 802, and pass the extended link pulses 704. The filter pin 904 receives the filtered output from the low pass filter 802a. A relay 907 is between the filter pins 904 and 906. The relay 907 is closed during discovery mode to allow passage of the extended link pulses 704, but opened during normal mode. The lowpass filter 802b further filters the output of the relay 907.

Figure 10:
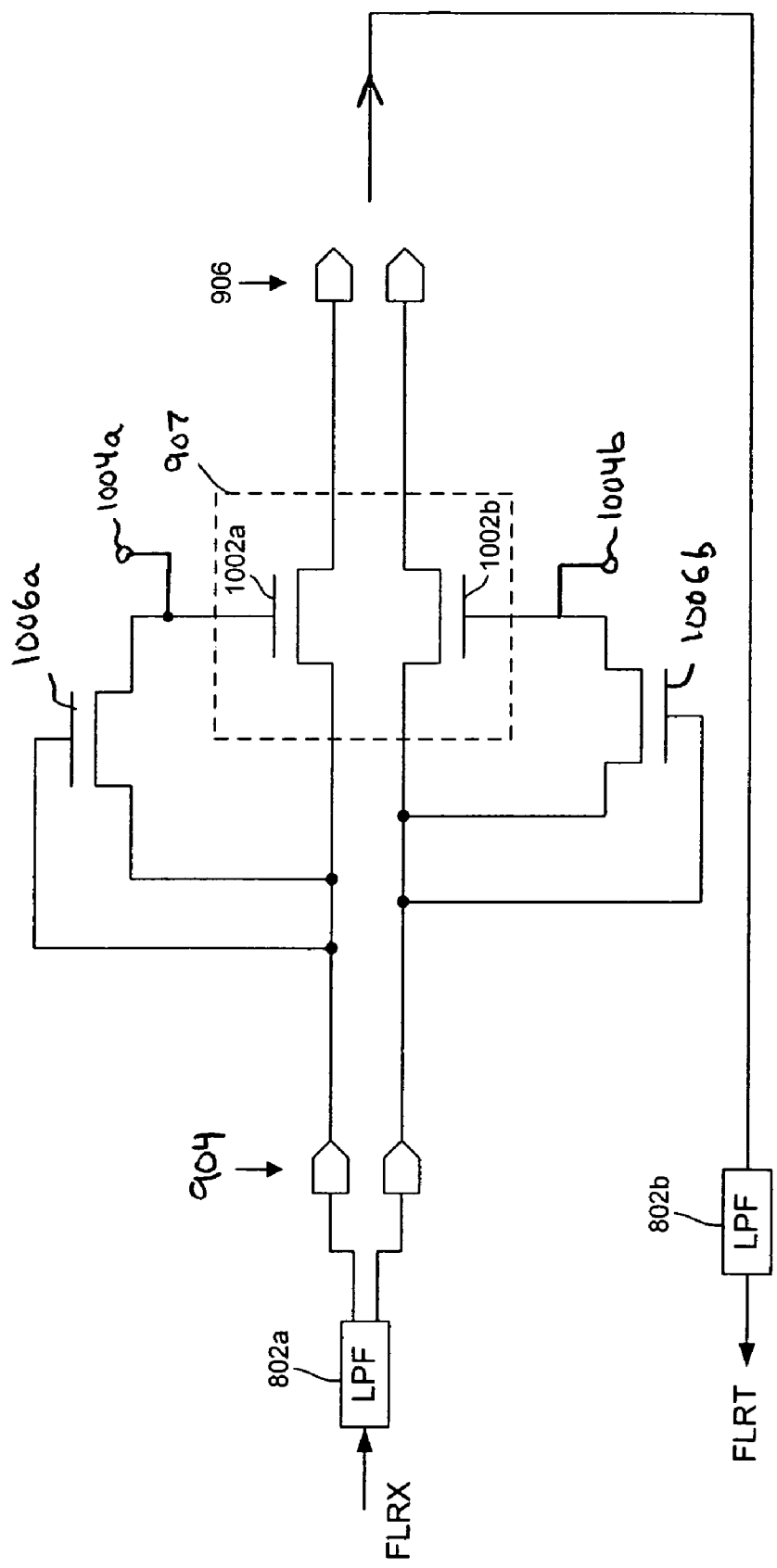
FIG. 10 further illustrates the physical layer device.

FIG. 10 illustrates the relays 907 being implemented with native FET devices 1002 that are naturally on, unless turned off via a negative voltage on the gate terminals 1004a and 1004b. Further, the FET devices 1006 are turned on during discovery mode, and provide an additional bias boost to the native FET devices 1002, to further reduce their on resistance.

Figure 11:
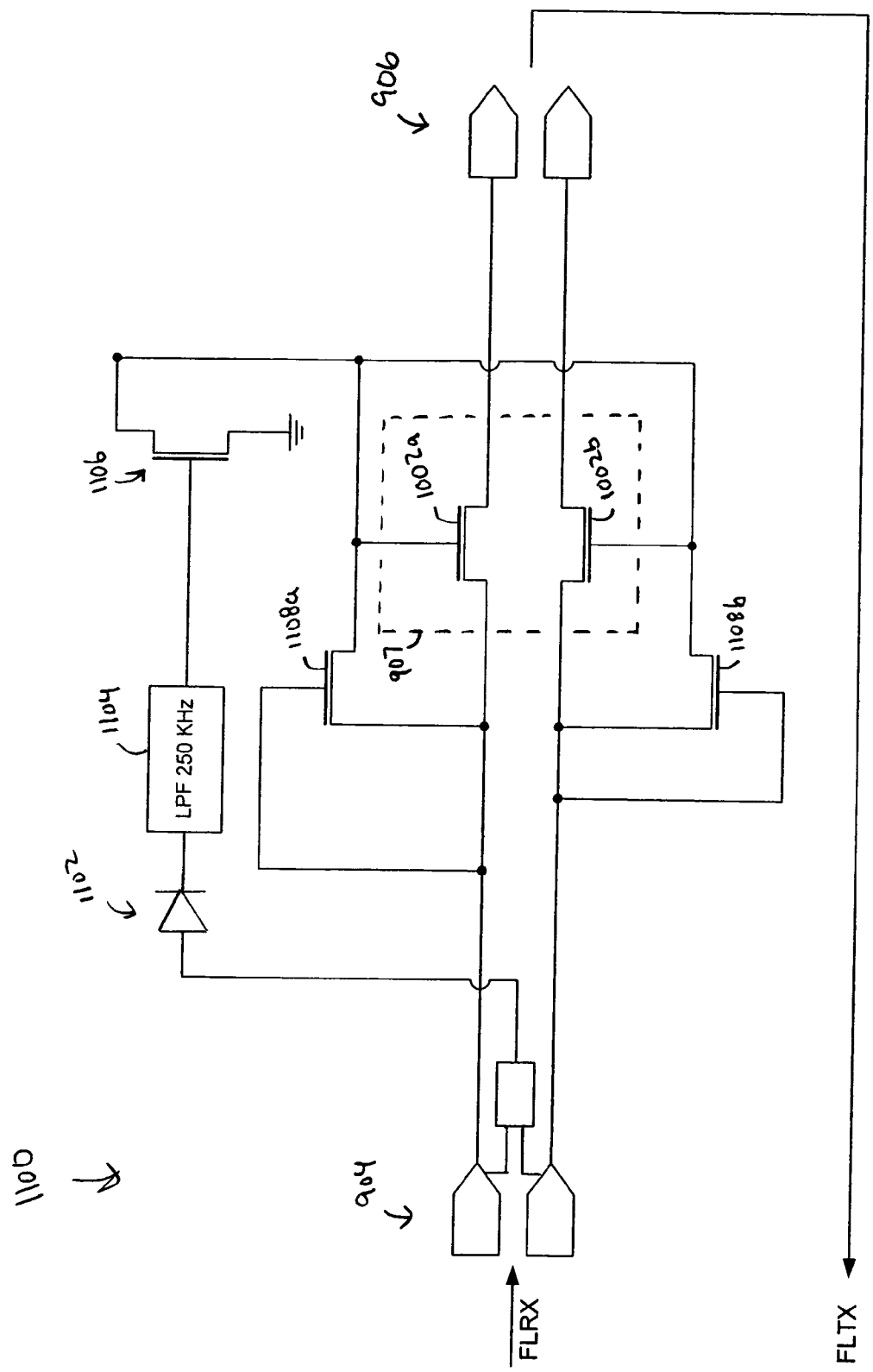
FIG. 11 further illustrates a physical layer device according to embodiments of the present invention, where a rectifier is used to turn-off the native relay devices for data packets during discovery mode.

FIG. 11 illustrates a physical layer device 1100 that addresses the concerns regarding short cable lengths discussed with reference to the communications systems 800 and the physical layer device 900. More specifically, the physical layer device 1100 prevents data packets 804 from being transmitted back to the switch 602, even when the LAN cable length is short.

Still referring to FIG. 11, the physical layer device 1100 includes native devices 1002 to provide the relay between the filter pins 904 and 906, as in FIG. 10. The physical layer device 1100 further includes a rectifier 1102 and a lowpass filter 1104 that are series coupled to the gate of an N-FET 1106. In an embodiment, the cutoff frequency of the lowpass filter 1104 is approximately 250 kHz. The source of the N-FET 1106 is coupled to ground and the drain is coupled to the gates of the native FETs 1002 as shown.

The physical layer device 1100 operates to shut-off the native devices for input signals that are highly continuous in nature, such as data packets. Stated another way, the physical layer device 1100 is configured to shut-off the native devices for input signals that have a relatively high signal duration. As discussed above, data packets are highly continuous relative extended link pulses, as they have signal durations that can last from 1-3 microseconds. However, the invention described herein is not limited to the mentioned signal periods for data packets, as the circuit elements can be tuned for other signal time periods, as will be understood by those skilled in arts.

During operation, the data packets 804 are received by the filter pins 904. The rectifier 1102 rectifies the data packets 804 to generate a rectified signal having an increasing amplitude over time. The rectified signal has a substantially low frequency (or even DC) and passes through the low pass filter 1104. The data packets 805 have a sufficiently high signal duration and are sufficiently continuous, that the rectified signal will increase to an amplitude sufficient to cause the N-FET 1106 to conduct, which grounds the gates of the native FETs 1002. In other words, the data packet signal duration of 1-3 microseconds is sufficient to generate a rectified signal large enough to cause the NFET 1106 to conduct and cut-off the native devices 1002. Accordingly, the data packets 804 will cause the native FETs 1002 to cut-off, preventing the data packets 804 from reaching the filter pins 906. Therefore, the data packets 804 are not re-transmitted to the switch 602, preventing an un-authorized loop transmission back to the switch. As such, there the physical layer device 1100 prevents IEEE violations for unauthorized loop transmission from IP phones that receive packets from legacy devices.

However, the extended link pulses 704 have a low signal duration when compared to that of the data packets 804, so that the rectifier 1102 cannot generate a rectified voltage that is sufficiently large to turn-on the N-FET 1106. In other words, the extended link pulses 704 are more sporadic than the data packets 804. Accordingly, the N-FET 1106 does not conduct for the extended link pulses 704, so that the native devices 1002 remain conducting for the extended link pulses 704. It is reminded that the native devices 1002 are normally "on" with 0 volts or no voltage on their gates. Accordingly, the extended link pulses are properly re-transmitted to the switch device 602, indicating a compatible IP phone or other conforming device at the DTE 610.

In summary, the rectifier 1102 and filter 1104 combination analyze the incoming pulses and produce a control voltage that grounds the gates of the native devices 1002 in the relay so as to cut-off the relay, but only for the more continuous data packets.

Devices 1108 further rectify the extended link pulses 704 received at the filter pins 904 so as to improve the conductivity of the native devices 1002 when receiving extended link pulses.

CONCLUSION

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A communications device, comprising:
   a substrate having an input and an output that is capable of being connected to a communications network;
   a relay, disposed on said substrate and connected between said input and said output of said substrate, said relay capable of being closed when no voltage is applied to said relay, said relay including a native field effect transistor (FET) having a source and a drain, said input to said substrate connected to one of said source and said drain, and said output connected to the other of said source and said drain;
   means for grounding a gate of said native field effect transistor responsive to a high duration signal received at said substrate input, wherein said high duration signal includes data packets that are associated with legacy devices.

2. The communications device of a claim 1, wherein said communications device includes one of: an IP phone, a wireless access point, a local switch, and wherein said communications device operates according to a discovery mode during auto-negotiation.

3. The communications device of claim 1, wherein said communications device is responsive to extended link pulses during a discovery mode, said extended link pulses having an active signal duration that is lower than that of said data packets.

4. The communications device of claim 3, wherein said means for grounding causes said relay to reject said data packets, and pass said extended link pulses during said discovery mode.

5. The communications device of claim 1, wherein said means for grounding includes:

a switch having a first terminal coupled to ground and a second terminal coupled to a control terminal of said native field effect transistor;
   a rectifier having an input coupled to said input of said substrate; and
   a low pass filter having an input coupled to an output of said rectifier, an output of said low pass filter coupled to said gate of said switch;
   wherein said switch, said rectifier, and said low pass filter are all integrated on said substrate.

6. The communications device of claim 5, wherein said rectifier rectifies said high duration signal to generate a rectified signal that closes said switch, thereby grounding a gate of said native device and causing said relay to reject said high duration signal.

7. The communications device of claim 6, wherein said rectifier does not rectify extended link pulses during a discovery mode so that said switch remains open when said rectifier receives said extended link pulses, thereby causing said relay to remain closed and pass said extended link pulses.

8. The communications device of claim 7, wherein said low pass filter has a cutoff frequency configured so that said switch is unresponsive to extended link pulses.

9. The communications device of claim 5, wherein said cutoff frequency is approximately 250 kHz.

10. The communications device of claim 5, further comprising a means for reducing resistance of said native device when receiving extended link pulses.

11. The communications device of claim 10, wherein said means for reducing includes a second rectifier having an input coupled to said substrate input and an output coupled to said gate of said native device.

12. The communications device of claim 11, wherein said second rectifier rectifies said extended link pulses so as to boost a gate voltage of said native device.

13. A communications device, comprising:
    a substrate having a differential input and a differential output that are capable of being connected to a communications network;
    a differential relay, disposed on said substrate and connected between said input and said output of said substrate, said differential relay including first and second native FETs that are conductive without a voltage on their respective gates;
    a switchable ground coupled to gates of said first and second native FET; and
    a rectifier and filter means that rectifies data packets to activate said switchable ground, thereby cutting-off said first and second native FETs and opening said differential relay so as to reject said data packets.

14. The communications device of claim 13, wherein said rectifier and filter means includes:
    a rectifier and filter series coupled to said differential input, and an output of said filter coupled to control said switchable ground.

15. The communications device of claim 13, wherein said rectifier and filter means is unresponsive to extended link pulses received at said differential input, so that said first and second native FETs remain conductive and pass said extended link pulses to said differential output.

16. The communications device of claim 15, wherein said extended link pulses are relatively less continuous than said data pulses.

17. The communications device of claim 15, wherein said data packets pulses have a higher active signal duration than said extended link pulses.

18. The communications device of claim 15, wherein said data packets provide auto-negotiation for legacy devices.

19. The communications device of claim 15, further comprising a second rectifier means for receiving said extended link pulses and boosting a gate voltage of said first and second native devices, so as to improve conductivity of said first and second native devices.

20. A communications device that receives data packets and extended link pulses, said data packets having a higher active signal duration than said extended link pulses, and said data packets associated with a legacy device, comprising:

a substrate having an input and an output that are capable of being connected to a communications network that transmits said extended link pulses and said data packets;

a relay, disposed on said substrate and connected between said input and said output of said substrate and having a control terminal, said relay configured to be conductive when no voltage is applied to said control terminal; and means, disposed on said substrate, for producing a control voltage that opens said relay upon receiving said data pulses.

21. The communications device of claim 20, wherein said means for producing is triggered by said higher signal duration of said data packets.

22. The communications device of claim 20, wherein said communications device is one of an IP phone, a wireless access point, and a local switch.

* * * * *